United States Patent
Iwasa

(10) Patent No.: US 6,810,344 B1
(45) Date of Patent: Oct. 26, 2004

(54) SEMICONDUCTOR TESTING METHOD AND SEMICONDUCTOR TESTING APPARATUS FOR SEMICONDUCTOR DEVICES, AND PROGRAM FOR EXECUTING SEMICONDUCTOR TESTING METHOD

(75) Inventor: Chie Iwasa, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 94 days.

(21) Appl. No.: 09/708,490

(22) Filed: Nov. 9, 2000

(30) Foreign Application Priority Data

Nov. 11, 1999 (JP) .......................................... P11-321105
Mar. 24, 2000 (JP) ..................................... P2000-085378

(51) Int. Cl.[7] ............................................ G11C 11/40
(52) U.S. Cl. ....................................................... 702/82
(58) Field of Search ..................... 702/82, 84; 341/165, 341/53; 327/94, 401, 50, 540; 323/283, 282; 714/718, 726, 733; 324/765, 537, 753; 365/201; 438/14; 455/522, 67.1; 371/20, 22.1; 703/14

(56) References Cited

U.S. PATENT DOCUMENTS

| | | | |
|---|---|---|---|
| 4,635,259 A | * | 1/1987 | Schinabeck et al. .......... 371/20 |
| 5,381,103 A | * | 1/1995 | Edmond et al. ............ 324/753 |
| 5,694,063 A | * | 12/1997 | Burlison et al. ............... 327/50 |
| 5,789,933 A | * | 8/1998 | Brown et al. ................ 324/765 |
| 5,889,409 A |   | 3/1999 | Kalb, Jr. |
| 6,140,832 A | * | 10/2000 | Vu et al. ..................... 324/765 |

FOREIGN PATENT DOCUMENTS

| | | |
|---|---|---|
| JP | 57-4560 | 1/1982 |
| JP | 62-286241 | 12/1987 |

* cited by examiner

*Primary Examiner*—John Barlow
*Assistant Examiner*—Tung Lau
(74) *Attorney, Agent, or Firm*—Finnegan, Henderson, Farabow, Garrett & Dunner, L.L.P.

(57) ABSTRACT

In the present invention, plural test vectors are supplied to good and faulty samples as semiconductor devices in order to measure current values, and change rates of the current values corresponding to each test vector are calculated. The change rates of the current values in the good and faulty samples are then compared, and address pairs of test vectors to be used in a pass/fail decision for semiconductor devices are determined based on the comparison results. Test vectors to be used for performing an emission analysis are obtained based on the change rates of the current values obtained from the good and faulty samples. The obtained test vectors are supplied to the faulty sample in order to perform the emission analysis, in which emission patterns of the good and faulty samples are compared, by using an emission microscope, and a part of a defect in the faulty sample is detected.

19 Claims, 24 Drawing Sheets

FIG. 4

PASSED SAMPLE PA

| | | |
|---|---|---|
| PAT=AAA | ADR=21 | IDDQ=1uA |
| | ADR=43 | IDDQ=3uA |
| | ADR=65 | IDDQ=5uA |
| | ADR=87 | IDDQ=1uA |
| | ADR=109 | IDDQ=1uA |
| | ADR=111 | IDDQ=1uA |
| | ADR=113 | IDDQ=1uA |
| PAT=BBB | ADR=17 | IDDQ=1uA |
| | ADR=19 | IDDQ=1uA |
| | ADR=21 | IDDQ=1uA |
| | ADR=24 | IDDQ=1uA |
| | ADR=26 | IDDQ=1uA |
| | ADR=28 | IDDQ=1uA |
| | ADR=30 | IDDQ=1uA |
| PAT=CCC | ADR=33 | IDDQ=2uA |
| | ADR=36 | IDDQ=1uA |
| | ADR=37 | IDDQ=5uA |
| | ADR=49 | IDDQ=1uA |

PASSED SAMPLE PB

| | | |
|---|---|---|
| PAT=AAA | ADR=21 | IDDQ=2uA |
| | ADR=43 | IDDQ=7uA |
| | ADR=65 | IDDQ=10uA |
| | ADR=87 | IDDQ=2uA |
| | ADR=109 | IDDQ=2uA |
| | ADR=111 | IDDQ=2uA |
| | ADR=113 | IDDQ=2uA |
| PAT=BBB | ADR=17 | IDDQ=2uA |
| | ADR=19 | IDDQ=2uA |
| | ADR=21 | IDDQ=2uA |
| | ADR=24 | IDDQ=2uA |
| | ADR=26 | IDDQ=2uA |
| | ADR=28 | IDDQ=2uA |
| | ADR=30 | IDDQ=2uA |
| PAT=CCC | ADR=33 | IDDQ=5uA |
| | ADR=36 | IDDQ=2uA |
| | ADR=37 | IDDQ=7uA |
| | ADR=49 | IDDQ=2uA |

PASSED SAMPLE PC

| | | |
|---|---|---|
| PAT=AAA | ADR=21 | IDDQ=6uA |
| | ADR=43 | IDDQ=10uA |
| | ADR=65 | IDDQ=15uA |
| | ADR=87 | IDDQ=6uA |
| | ADR=109 | IDDQ=6uA |
| | ADR=111 | IDDQ=6uA |
| | ADR=113 | IDDQ=6uA |
| PAT=BBB | ADR=17 | IDDQ=6uA |
| | ADR=19 | IDDQ=6uA |
| | ADR=21 | IDDQ=6uA |
| | ADR=24 | IDDQ=6uA |
| | ADR=26 | IDDQ=6uA |
| | ADR=28 | IDDQ=6uA |
| | ADR=30 | IDDQ=6uA |
| PAT=CCC | ADR=33 | IDDQ=6uA |
| | ADR=36 | IDDQ=10uA |
| | ADR=37 | IDDQ=15uA |
| | ADR=49 | IDDQ=6uA |

FIG. 5

FAULTY SAMPLE FA

| PAT=AAA | ADR=21  | IDDQ=2uA  |
|---------|---------|-----------|
|         | ADR=43  | IDDQ=3uA  |
|         | ADR=65  | IDDQ=10uA |
|         | ADR=87  | IDDQ=2uA  |
|         | ADR=109 | IDDQ=5uA  |
|         | ADR=111 | IDDQ=5uA  |
|         | ADR=113 | IDDQ=2uA  |
| PAT=BBB | ADR=17  | IDDQ=2uA  |
|         | ADR=19  | IDDQ=2uA  |
|         | ADR=21  | IDDQ=5uA  |
|         | ADR=24  | IDDQ=5uA  |
|         | ADR=26  | IDDQ=5uA  |
|         | ADR=28  | IDDQ=2uA  |
|         | ADR=30  | IDDQ=2uA  |
| PAT=CCC | ADR=33  | IDDQ=3uA  |
|         | ADR=36  | IDDQ=2uA  |
|         | ADR=37  | IDDQ=5uA  |
|         | ADR=49  | IDDQ=2uA  |

FAULTY SAMPLE FB

| PAT=AAA | ADR=21  | IDDQ=1uA  |
|---------|---------|-----------|
|         | ADR=43  | IDDQ=4uA  |
|         | ADR=65  | IDDQ=30uA |
|         | ADR=87  | IDDQ=1uA  |
|         | ADR=109 | IDDQ=1uA  |
|         | ADR=111 | IDDQ=1uA  |
|         | ADR=113 | IDDQ=1uA  |
| PAT=BBB | ADR=17  | IDDQ=1uA  |
|         | ADR=19  | IDDQ=5uA  |
|         | ADR=21  | IDDQ=1uA  |
|         | ADR=24  | IDDQ=1uA  |
|         | ADR=26  | IDDQ=1uA  |
|         | ADR=28  | IDDQ=1uA  |
|         | ADR=30  | IDDQ=1uA  |
| PAT=CCC | ADR=33  | IDDQ=3uA  |
|         | ADR=36  | IDDQ=1uA  |
|         | ADR=37  | IDDQ=4uA  |
|         | ADR=49  | IDDQ=1uA  |

FAULTY SAMPLE FC

| PAT=AAA | ADR=21  | IDDQ=14.72uA |
|---------|---------|--------------|
|         | ADR=43  | IDDQ=15.20uA |
|         | ADR=65  | IDDQ=15.80uA |
|         | ADR=87  | IDDQ=14.00uA |
|         | ADR=109 | IDDQ=17.08uA |
|         | ADR=111 | IDDQ=15.82uA |
|         | ADR=113 | IDDQ=15.26uA |
| PAT=BBB | ADR=17  | IDDQ=17.80uA |
|         | ADR=19  | IDDQ=17.82uA |
|         | ADR=21  | IDDQ=15.24uA |
|         | ADR=24  | IDDQ=15.94uA |
|         | ADR=26  | IDDQ=16.54uA |
|         | ADR=28  | IDDQ=17.20uA |
|         | ADR=30  | IDDQ=17.20uA |
| PAT=CCC | ADR=33  | IDDQ=17.80uA |
|         | ADR=36  | IDDQ=17.72uA |
|         | ADR=37  | IDDQ=14.62uA |
|         | ADR=49  | IDDQ=15.40uA |

FIG. 7

EXAMPLE OF DEFINITION FOR CHANGE
RATE "C" OF CURRENT VALUE

WHEN b > a $$C = \frac{b - a}{a}$$

WHEN a > b $$C = \frac{a - b}{b}$$

a: CURRENT VALUE BEFORE CHANGE
b: CURRENT VALUE AFTER CHANGE

FIG. 8

CALCULATING CHANGE RATE OF CURRENT VALUE PER SAMPLE — S60

DETERMINING ADDRESS PAIR — S61

INSERTING MEASURED DATA a AND b OF ADDRESSES PER ADDRESS PAIR INTO (b−a)/a OR (a−b)/b — S62

OUTPUTTING CHANGE RATE "C" OF CURRENT VALUE PER ADDRESS PAIR — S63

RETURN

FIG. 9

ONE EXAMPLE OF CHANGE RATE OF CURRENT VALUE PER ADDRESS PAIR IN PASSED SAMPLE

| COMBINATION OF CONTINUOUS TWO TEST VECTORS (ADDRESS PAIR) | CHANGE RATE | | | STANDARD RANGE OF CHANGE RATE OF CURRENT VALUE | | | | |
|---|---|---|---|---|---|---|---|---|
| | PA | PB | PC | MIN. VALUE Cs | MAX. VALUE Cl | α | Cs−α | Cl+α |
| PAT=AAA ADR=21,43 | 2 | 2.5 | 0.7 | 0.7 | 2.5 | 0.9 | −0.2 | 3.4 |
| ADR=43,65 | 0.7 | 0.4 | 0.5 | 0.4 | 0.7 | 0.15 | 0.25 | 0.85 |
| ADR=65,87 | −4 | −4 | −1.5 | −4 | −1.5 | 1.25 | −5.25 | −0.25 |
| ADR=87,109 | 0 | 0 | 0 | 0 | 0 | 0 | 0 | 0 |
| ADR=109,111 | 0 | 0 | 0 | 0 | 0 | 0 | 0 | 0 |
| ADR=111,113 | 0 | 0 | 0 | 0 | 0 | 0 | 0 | 0 |
| ADR=113,PAT=BBB ADR=17 | 0 | 0 | 0 | 0 | 0 | 0 | 0 | 0 |
| PAT=BBB ADR=17,19 | 0 | 0 | 0 | 0 | 0 | 0 | 0 | 0 |
| ADR=19,21 | 0 | 0 | 0 | 0 | 0 | 0 | 0 | 0 |
| ADR=21,24 | 0 | 0 | 0 | 0 | 0 | 0 | 0 | 0 |
| ADR=24,26 | 0 | 0 | 0 | 0 | 0 | 0 | 0 | 0 |
| ADR=26,28 | 0 | 0 | 0 | 0 | 0 | 0 | 0 | 0 |
| ADR=28,30 | 0 | 0 | 0 | 0 | 0 | 0 | 0 | 0 |
| ADR=30,PAT=CCC ADR=33 | 1 | 1.5 | 0.7 | 0.7 | 1.5 | 0.4 | 0.3 | 1.9 |
| PAT=CCC ADR=33,36 | −1 | −1.5 | −0.7 | −1.5 | −0.7 | 0.4 | −1.9 | −0.3 |
| ADR=36,37 | 4 | 2.5 | 1.5 | 1.5 | 4 | 1.25 | 0.25 | 5.25 |
| ADR=37,49 | −4 | −2.5 | −1.5 | −4 | −1.5 | 1.25 | −5.25 | −0.25 |

α : (MAX. VALUE − MIN. VALUE)/2

CRITERIA RANGE CHANGE RATE "L"

$$Cs - \alpha < L < Cl + \alpha$$

Cs: MIN. VALUE OF CHANGE RATE OF CURRENT VALUE IN PASSED SAMPLE
Cl: MAX. VALUE OF CHANGE RATE OF CURRENT VALUE IN PASSED SAMPLE
$\alpha$: ERROR (=(Cl-Cs)/2)

FIG. 11

ONE EXAMPLE OF CHANGE RATE OF CURRENT VALUE PER ADDRESS PAIR IN FAULTY SAMPLE

| COMBINATION OF CONTINUOUS TWO TEST VECTORS (ADDRESS PAIR) | | RELATIONSHIP TO CHANGE RATE "C"/RANGE "L" OF DECISION CRITERIA ($Cs-\alpha < L < Cl+\alpha$) | | | | | | RANGE "L" OF DECISION CRITERIA | |
|---|---|---|---|---|---|---|---|---|---|
| | | FA | OUT OF RANGE | FB | OUT OF RANGE | FC | OUT OF RANGE | $Cs-\alpha$ | $Cl+\alpha$ |
| PAT=AAA | ADR=21,43 | 0.5 | | 3 | | 0.03 | | -0.2 | 3.4 |
| | ADR=43,65 | 2.3 | >L | 14 | | 0.04 | | 0.25 | 0.85 |
| | ADR=65,87 | -4 | >L | -60 | | -0.13 | | -5.25 | -0.25 |
| | ADR=87,109 | 1.5 | | 0 | >L | 0.22 | >L | 0 | 0 |
| | ADR=109,111 | 0 | <L | 0 | <L | 0.08 | >L | 0 | 0 |
| | ADR=111,113 | -1.5 | | 0 | | 0.04 | >L | 0 | 0 |
| | ADR=113,PAT=BBB ADR=17 | 0 | | 4 | | 0.17 | >L | 0 | 0 |
| PAT=BBB | ADR=17,19 | 0 | >L | -4 | >L | 0 | >L | 0 | 0 |
| | ADR=19,21 | 1.5 | | 0 | <L | -0.17 | <L | 0 | 0 |
| | ADR=21,24 | 0 | | 0 | | 0.05 | >L | 0 | 0 |
| | ADR=24,26 | 0 | <L | 0 | | 0.04 | >L | 0 | 0 |
| | ADR=26,28 | -1.5 | | 0 | | 0.03 | >L | 0 | 0 |
| | ADR=28,30 | 0 | | 2 | >L | 0 | <L | 0 | 0 |
| | ADR=30,PAT=CCC ADR=33 | 0.5 | >L | -2 | <L | 0.03 | >L | 0.3 | 1.9 |
| PAT=CCC | ADR=33,36 | -0.5 | | 3 | | 0 | >L | -1.9 | -0.5 |
| | ADR=36,37 | 1.5 | <L | | | -0.21 | <L | 0.25 | 5.25 |
| | ADR=37,49 | -1.5 | >L | -3 | | 0.05 | >L | -5.25 | -0.25 |

Cs: MIN. VALUE, Cl: MAX. VALUE, $\alpha = (Cl-Cs)/2$

FIG. 16

| PASSED SAMPLE PA | PASSED SAMPLE PB | PASSED SAMPLE PC |
|---|---|---|
| PAT=AAA ADR=21 IDDQ=1uA<br>ADR=43 IDDQ=3uA<br>ADR=65 IDDQ=5uA<br>ADR=87 IDDQ=1uA<br>ADR=109 IDDQ=1uA<br>ADR=111 IDDQ=1uA<br>ADR=113 IDDQ=1uA<br>PAT=BBB ADR=17 IDDQ=1uA<br>ADR=19 IDDQ=1uA<br>ADR=21 IDDQ=1uA<br>ADR=24 IDDQ=1uA<br>ADR=26 IDDQ=1uA<br>ADR=28 IDDQ=1uA<br>ADR=30 IDDQ=1uA<br>PAT=CCC ADR=33 IDDQ=2uA<br>ADR=36 IDDQ=1uA<br>ADR=37 IDDQ=5uA<br>ADR=49 IDDQ=1uA<br>⋮ | PAT=AAA ADR=21 IDDQ=2uA<br>ADR=43 IDDQ=7uA<br>ADR=65 IDDQ=10uA<br>ADR=87 IDDQ=2uA<br>ADR=109 IDDQ=2uA<br>ADR=111 IDDQ=2uA<br>ADR=113 IDDQ=2uA<br>PAT=BBB ADR=17 IDDQ=2uA<br>ADR=19 IDDQ=2uA<br>ADR=21 IDDQ=2uA<br>ADR=24 IDDQ=2uA<br>ADR=26 IDDQ=2uA<br>ADR=28 IDDQ=2uA<br>ADR=30 IDDQ=2uA<br>PAT=CCC ADR=33 IDDQ=5uA<br>ADR=36 IDDQ=2uA<br>ADR=37 IDDQ=7uA<br>ADR=49 IDDQ=2uA<br>⋮ | PAT=AAA ADR=21 IDDQ=6uA<br>ADR=43 IDDQ=10uA<br>ADR=65 IDDQ=15uA<br>ADR=87 IDDQ=6uA<br>ADR=109 IDDQ=6uA<br>ADR=111 IDDQ=6uA<br>ADR=113 IDDQ=6uA<br>PAT=BBB ADR=17 IDDQ=6uA<br>ADR=19 IDDQ=6uA<br>ADR=21 IDDQ=6uA<br>ADR=24 IDDQ=6uA<br>ADR=26 IDDQ=6uA<br>ADR=28 IDDQ=6uA<br>ADR=30 IDDQ=6uA<br>PAT=CCC ADR=33 IDDQ=6uA<br>ADR=36 IDDQ=10uA<br>ADR=37 IDDQ=15uA<br>ADR=49 IDDQ=6uA<br>⋮ |

| FAULTY SAMPLE FA | FAULTY SAMPLE FB | FAULTY SAMPLE FC |
|---|---|---|
| PAT=AAA ADR=21 IDDQ=2uA<br>ADR=43 IDDQ=3uA<br>ADR=65 IDDQ=10uA<br>ADR=87 IDDQ=2uA<br>ADR=109 IDDQ=5uA<br>ADR=111 IDDQ=5uA<br>ADR=113 IDDQ=2uA<br>PAT=BBB ADR=17 IDDQ=2uA<br>ADR=19 IDDQ=2uA<br>ADR=21 IDDQ=5uA<br>ADR=24 IDDQ=5uA<br>ADR=26 IDDQ=5uA<br>ADR=28 IDDQ=2uA<br>ADR=30 IDDQ=2uA<br>PAT=CCC ADR=33 IDDQ=3uA<br>ADR=36 IDDQ=2uA<br>ADR=37 IDDQ=5uA<br>ADR=49 IDDQ=2uA<br>⋮ | PAT=AAA ADR=21 IDDQ=1uA<br>ADR=43 IDDQ=4uA<br>ADR=65 IDDQ=30uA<br>ADR=87 IDDQ=1uA<br>ADR=109 IDDQ=1uA<br>ADR=111 IDDQ=1uA<br>ADR=113 IDDQ=1uA<br>PAT=BBB ADR=17 IDDQ=1uA<br>ADR=19 IDDQ=5uA<br>ADR=21 IDDQ=1uA<br>ADR=24 IDDQ=1uA<br>ADR=26 IDDQ=1uA<br>ADR=28 IDDQ=1uA<br>ADR=30 IDDQ=1uA<br>PAT=CCC ADR=33 IDDQ=3uA<br>ADR=36 IDDQ=1uA<br>ADR=37 IDDQ=4uA<br>ADR=49 IDDQ=1uA<br>⋮ | PAT=AAA ADR=21 IDDQ=14.72uA<br>ADR=43 IDDQ=15.20uA<br>ADR=65 IDDQ=15.80uA<br>ADR=87 IDDQ=14.00uA<br>ADR=109 IDDQ=17.08uA<br>ADR=111 IDDQ=15.82uA<br>ADR=113 IDDQ=15.26uA<br>PAT=BBB ADR=17 IDDQ=17.80uA<br>ADR=19 IDDQ=17.82uA<br>ADR=21 IDDQ=15.24uA<br>ADR=24 IDDQ=15.94uA<br>ADR=26 IDDQ=16.54uA<br>ADR=28 IDDQ=17.20uA<br>ADR=30 IDDQ=17.20uA<br>PAT=CCC ADR=33 IDDQ=17.80uA<br>ADR=36 IDDQ=17.72uA<br>ADR=37 IDDQ=14.62uA<br>ADR=49 IDDQ=15.40uA<br>⋮ |

FIG. 18

WHEN CURRENT VALUE BEFORE CHANGE IS "a", AND, "b" AFTER CHANGE IN OPTIONALLY CHANGEABLE TWO MEASURING ADDRESSES THAT ARE OPTIONALLY CHANGEABLE, CHANGE RATE "C" IS DEFINED AS FOLLOWS.

WHEN b > a $$C = \frac{b-a}{a}$$

WHEN a > b $$C = \frac{a-b}{b}$$

WHEN MIN. VALUE IS Cs AND MAX. VALUE IS Cl IN CHANGE RATES OF PASSE SAMPLE, RANGE "L" OF CHANGE RATE OF PASSED SAMPLE IS AS FOLLOWS.

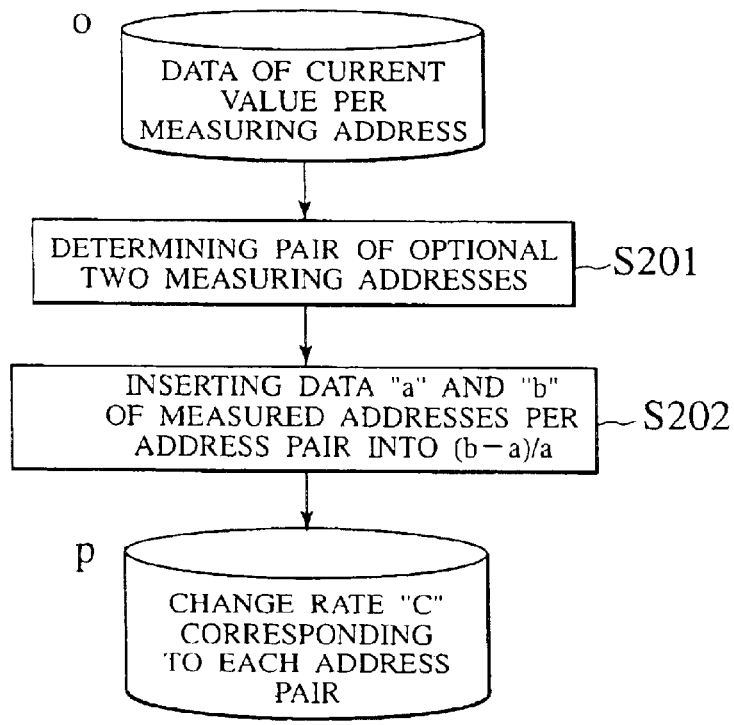

FIG. 20A

CHANGE RATE OF CURRENT VALUE PER ADDRESS PAIR IN PASSED SAMPLES

| PAIR OF CONTINUOUS TWO TEST VECTORS | | CHANGE RATE | | | RANGE OF PASSED SAMPLE | |
|---|---|---|---|---|---|---|
| | | PA | PB | PC | MIN. | MAX. |
| PAT=AAA | ADR=21,43 | 2 | 2.5 | 0.7 | 0.7 | 2.5 |
| | ADR=43,65 | 0.7 | 0.4 | 0.5 | 0.4 | 0.7 |
| | ADR=65,87 | -4 | -4 | -1.5 | -4 | -1.5 |
| | ADR=87,109 | 0 | 0 | 0 | 0 | 0 |
| | ADR=109,111 | 0 | 0 | 0 | 0 | 0 |
| | ADR=111,113 | 0 | 0 | 0 | 0 | 0 |
| | ADR=113,PAT=BBB ADR=17 | 0 | 0 | 0 | 0 | 0 |
| PAT=BBB | ADR=17,19 | 0 | 0 | 0 | 0 | 0 |
| | ADR=19,21 | 0 | 0 | 0 | 0 | 0 |
| | ADR=21,24 | 0 | 0 | 0 | 0 | 0 |
| | ADR=24,26 | 0 | 0 | 0 | 0 | 0 |
| | ADR=26,28 | 0 | 0 | 0 | 0 | 0 |
| | ADR=28,30 | 0 | 0 | 0 | 0 | 0 |
| | ADR=30,PAT=CCC ADR=33 | 1 | 1.5 | 0.7 | 0.7 | 1.5 |
| PAT=CCC | ADR=33,36 | -1 | -1.5 | -0.7 | -1.5 | -0.7 |
| | ADR=36,37 | 4 | 2.5 | 1.5 | 1.5 | 4 |
| | ADR=37,49 | -4 | -2.5 | -1.5 | -4 | -1.5 |

FIG. 20B

CHANGE RATE OF CURRENT VALUE PER ADDRESS PAIR IN FAULTY SAMPLES

| PAIR OF CONTINUOUS TWO TEST VECTORS | | CHANGE RATE "C"/OUT OF RANGE OF PASSED SAMPLE ? | | | | | | RANGE OF PASSED SAMPLE | |
|---|---|---|---|---|---|---|---|---|---|
| | | FA | DIFFE-RENCE | FB | DIFFE-RENCE | FC | DIFFE-RENCE | MIN. | MAX. |
| PAT=AAA | ADR=21,43 | 0.5 | -0.2 | 3 | +0.5 | 0.03 | -0.87 | 0.7 | 2.5 |
| | ADR=43,65 | 2.3 | +1.8 | 14 | +13.3 | 0.04 | -0.38 | 0.4 | 0.7 |
| | ADR=65,87 | -4 | | -60 | -56 | -0.13 | +0.37 | -4 | -1.5 |
| | ADR=87,109 | 1.5 | +1.5 | 0 | | 0.22 | +0.22 | 0 | 0 |
| | ADR=109,111 | 0 | | 0 | | 0.08 | +0.08 | 0 | 0 |
| | ADR=111,113 | -1.5 | -1.5 | 0 | | 0.04 | +0.04 | 0 | 0 |
| | ADR=113,PAT=BBB ADR=17 | 0 | | 0 | | 0.17 | +0.17 | 0 | 0 |
| PAT=BBB | ADR=17,19 | 0 | | 4 | +4 | 0 | | 0 | 0 |
| | ADR=19,21 | 1.5 | +1.5 | -4 | -4 | -0.17 | -0.17 | 0 | 0 |
| | ADR=21,24 | 0 | | 0 | | 0.05 | +0.05 | 0 | 0 |
| | ADR=24,26 | 0 | | 0 | | 0.04 | +0.05 | 0 | 0 |
| | ADR=26,28 | -1.5 | -1.5 | 0 | | 0.03 | +0.03 | 0 | 0 |
| | ADR=28,30 | 0 | | 0 | | 0 | | 0 | 0 |
| | ADR=30,PAT=CCC ADR=33 | 0.5 | -0.2 | 2 | +0.5 | 0.03 | -0.07 | 0.7 | 1.5 |
| PAT=CCC | ADR=33,36 | -0.5 | -0.2 | -2 | -0.5 | 0 | +0.7 | -1.5 | -0.7 |
| | ADR=36,37 | 1.5 | | 3 | | -0.21 | -1.71 | 1.5 | 4 |
| | ADR=37,49 | -1.5 | | -3 | | 0.03 | +1.45 | -4 | -1.5 |

FIG. 25A
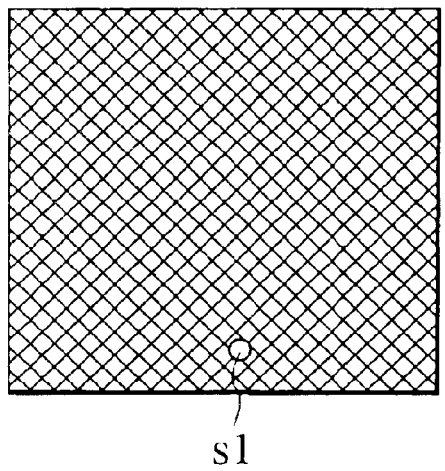
s1
FIG. 25B
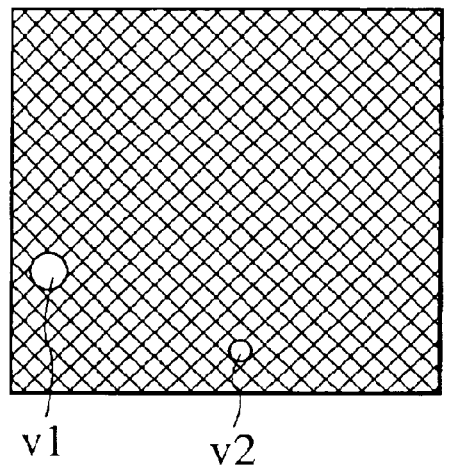
v1    v2
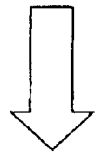
FIG. 25C
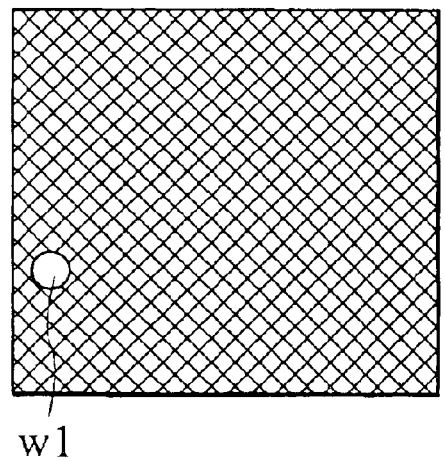
w1

SEMICONDUCTOR TESTING METHOD AND SEMICONDUCTOR TESTING APPARATUS FOR SEMICONDUCTOR DEVICES, AND PROGRAM FOR EXECUTING SEMICONDUCTOR TESTING METHOD

CROSS-REFERENCE TO RELATED APPLICATION

This application claims benefit of priority under 35 USC § 119 to both Japanese Patent Applications No. 1999-321105, filed on Nov. 11, 1999, and No. 2000-085378, filed on Mar. 24, 2000, the entire contents of which are incorporated herein by reference herein.

BACKGROUND OF THE INVENTION

1. Field of the Invention

The present invention relates to the field of testing for analyzing defects in semiconductor devices, and, more particularly, to a semiconductor testing method, and a semiconductor testing apparatus for deciding whether a semiconductor device is a good (non-defective) device having no defect or it contains defeats by using IDDQ testing technique, and a program for executing the semiconductor testing method, and the present invention also relates to a semiconductor testing method and a semiconductor testing apparatus for specifying one or more faulty parts involved in the semiconductor device.

2. Description of the Related Art

Recently, the circuit size of a semiconductor chip is enormously increased with an increase of the degree of a microstructure of a semiconductor circuit as a semiconductor device. It is therefore difficult to detect and specify the cause of a fault occurred in the complicated semiconductor circuit.

In particularly, the generation of test vectors to be used for detecting various faults in the semiconductor device with a higher detection rate requires considerable workers and long working time even if the test vectors are generated only by manual or an automatic test pattern generator (ATPG) that generate test vectors.

In addition, it is difficult to detect defects in a semiconductor device having a complicated structure and a large integrated size only by performing functional testing. In order to avoid this drawback, attention is being given to IDDQ testing having a higher detection rate as a new testing technology. This IDDQ testing is a testing method using existing test vectors capable of obtaining a higher detection rate.

By the way, conventionally, when existing test vectors are used in the measurement based on the IDDQ testing, a circuit designer selects the test vectors matched to target circuits for testing. Furthermore, an available IDDQ test vector extraction tool is used as one of recently effective testing methods in order to select effective test vectors.

However, it is considerably difficult to select effective test vectors for performing IDDQ measuring according to the circuit designer's judgment, and the test vectors selected in estimation are not always effective for detecting defects. As a result, an operator cannot select the test vectors efficiently, and much time is thereby spent in measurement using no effective test vectors. In addition, the using of an available IDDQ test-vector extracting tool needs to keep the circumstance for the execution of this tool. That is, firstly, the available IDDQ test-vector extracting tool is selected, and this tool is then installed into a system including storage means such as a hard disk. Furthermore, it is necessary to convert information such as circuits and test vectors into data of a dedicated format that cFan be executed by this tool. This format conversion for the execution of the tool requires much working time. In order to avoid this drawback, it is sometimes necessary to develop a dedicated tool to be used only for this format conversion.

On the other hand, the available IDDQ test-vector extracting tool extracts only test vectors estimated by the execution of a computer simulation. Accordingly, all the estimated test vectors are not always effective. In general, it is often happened that a faulty item detected after actual mass production and before shipping has a limited faulty part in a circuit in the faulty item. On the contrary, because the available IDDQ test-vector extracting tool estimates and generates the test vectors based on the measurement for the entire circuits in a target semiconductor device, the estimated test vectors includes un-necessary test vectors in judgment of the defective item having a limited faulty part. This spends unnecessary much time in the IDDQ measurement. Moreover, in the prior art, the current value corresponding to a test vector is used in the judgment to detect and select a faulty sample. This judgment method decides a sample having a current value that is in excess of a standard current value as a faulty item, and a sample of a current value that is not more than a current-value criteria as a good sample (namely, a non-defective sample as a passed device that is within a manufacture's tolerance level and may be sold to a customer). Accordingly, this conventional judgment method judges a sample as a passed device even if the current value of this sample has a larger current-value change rate, but not in excess of the current value criteria. This conventional judgment method misses to detect a faulty sample correctly.

By the way, there is a case that a manufacture cannot detect any defect in a semiconductor product that has been passed in manufacture's testing (namely, the semiconductor product is within a manufacture's tolerance level and may be sold to a customer), but returned from user as a fault product after shipping. To obtain the method to efficiently specify defects in the faulty product presents an important problem. For example, an emission analysis using the IDDQ testing has been performed. This mission analysis using the IDDQ testing measures a current value output from a target semiconductor circuit using existence test vectors. The emission analysis is then performed in order to detect defective parts in the faulty sample having unique emission by using the test vectors corresponding to the current values that are larger than the current value detected in the passed sample.

In the conventional emission analysis described above based on the IDDQ testing, all the unique emission parts detected in the faulty sample are used for the faulty analysis. This causes a time-wasting in the emission analysis because this emission analysis is performed based on the inefficient test vectors including the analysis for the emission parts that are not generated by the defects.

Recently, there is a possibility to flow the current continuously in the passed sample having a complicated circuit structure. This type of current gives no effect to the operation. On the contrary, the conventional emission analysis using the test vectors corresponding to the current values which are greater than that of the passed sample omits the faulty sample having the current value that is smaller than that of the passed sample from the emission analysis. That is, it is impossible to detect the faulty sample having a larger current value.

As described above, because the conventional emission analysis to analyze faulty samples is not always effective, there is no means to specify the position of a faulty part in the faulty sample having a small current value when compared with the current value flowing through the passed sample. Accordingly, it is difficult to obtain effective test vectors to be used during the emission measurement and to specify the defective part in the faulty sample. Thereby, the operator gives up the execution of the emission measurement using effective test vectors. Further, in the conventional method to specify the faulty part based on the current value data, because the current values between the passed sample and the faulty sample corresponding to a test vector are compared and the emission measurement is performed only when the current value of the faulty sample is greater than that of the passed sample, it has not performed to compare the emission parts in the faulty sample using the difference of current values per address pair indicating the test vectors. In other words, in the prior art there is no attention to consider the difference of the current values per test vector pair for each of the passed sample and the faulty sample. Thereby, the operator often misses to detect the phenomenon caused by the change of current values that occurs between the test vector and this phenomenon is also unique to the faulty sample, but is not caused in the passed sample.

SUMMARY OF THE INVENTION

Accordingly, an object of the present invention is, with due consideration to the drawbacks of the conventional technique, to provide a semiconductor testing method and a semiconductor testing apparatus for semiconductor devices, and a program for performing the semiconductor testing method. These method, apparatus, and program are capable of detecting faulty devices efficiently with a high faulty detection rate, and of specifying one or more defect parts in a faulty device that cannot be detected by any conventional semiconductor testing method, and of reducing the analysis time that is necessary to analyze the cause of the defects with a high throughput.

In accordance with a preferred embodiment of the present invention, a semiconductor testing apparatus comprises: a read circuit for reading measurement data including a plurality of test vectors; a measurement circuit for supplying the test vectors to semiconductor devices and for measuring a current value output from the semiconductor devices corresponding to each address of each test vector; a calculation circuit for calculating a current-value change rate per address pair consisting of different two addresses; a determination circuit for determining a range of pass/fail decision criteria to be used for deciding whether a semiconductor device as a target test device to be tested is a good sample or a fault sample based on current-value change rates obtained by supplying the plurality of test vectors to good samples as semiconductor devices; and a decision circuit for comparing current-value change rates obtained by supplying the plurality of test vectors to faulty samples with the range of pass/fail decision criteria per address pair, and for deciding whether the target test device is a good sample as a non-defective semiconductor device or a faulty sample based on the current-value change rates corresponding to the address pairs extracted based on the comparison results obtained.

In addition, in the semiconductor testing device, the determination circuit determines the range of pass/fail decision criteria based on the current-value change rates obtained from the plural good samples.

In the semiconductor testing apparatus, the range of pass/fail decision criteria is determined based on the current-value change rates obtained from the good samples, and the current-value change rates obtained from the target semiconductor device are then compared with the range of pass/fail decision criteria, so that it is possible to detect a faulty sample that cannot be detected by any conventional semiconductor testing apparatus.

It is also preferable that the determination circuit determines the range of pass/fail decision criteria based on a plurality of the current-value change rates obtained from the plural good (non-defective) samples (namely, from the passed samples).

In addition, the determination circuit in the semiconductor testing apparatus extracts the maximum value and the minimum value in a plurality of the current-value change rates per address pair and determines the range of pass/fail decision criteria per address pair based on the extracted them. Further, the determination circuit finally determines the range of pass/fail decision criteria in consideration of an desired error of the range of pass/fall decision criteria.

In the semiconductor testing apparatus as another preferred embodiment, the determination circuit comprises a measurement range determination circuit for comparing current-value change rates of the faulty samples obtained by supplying the plurality of test vectors to the faulty samples with the range of pass/fail decision criteria per address pair, and for extracting the address pairs corresponding to the current-value change rates of the faulty samples that are out of the range of pass/fail decision criteria from the plurality of address pairs in the plurality of test vectors, and for determining effective address pairs as an address pair group to be effectively used for the pass/fall decision. In the semiconductor testing apparatus, the measurement circuit supplies the test vectors corresponding to the address pair group to the target test device.

Thereby, it is possible to eliminate addresses (namely, test vectors) having a small detection rate to detect defects from the addresses that are used during a mass production testing. As a result, it is possible to extract effective test vectors that are substantially useful.

In the semiconductor testing apparatus as another preferred embodiment, it is further desirable that the measurement range determination circuit compares the plural current-value change rates obtained from the plural faulty samples with the range of pass/fail decision criteria per address pair, and selects an effective address pair group, to be effectively more used for the pass/fail decision and according to the number of the plural faulty samples, from the address pair group of the plural test vectors in the address pairs corresponding to the current-value change rates of the plural faulty samples which are out of the range of pass/fall decision criteria.

It is thereby possible to select the test vectors to be used during a mass production testing in order with a high defection efficiency. As a result, it is possible to further extract the test vectors according to a required specification.

In accordance with another preferred embodiment of the present invention, a semiconductor testing method comprises the steps of: inputting a plurality of test vectors to semiconductor devices each being a good devices as a non-defective device, and measuring a current value output from each good sample corresponding to an address of each test vector, and outputting the measured current values as the current values of the good samples; calculating a current-value change rate per address pair forming two different addresses, and outputting this current-value change rate as the current-value change rate of the good sample; determining a range of pass/fail decision criteria to be used for deciding whether a target test device to be tested is a good sample (non-defective sample) or a fault sample per address pair based on the above current-value change rates; and supplying the plural test vectors to semiconductor devices as faulty samples, and measuring current values output from the above semiconductor devices as the faulty samples corresponding to the addresses, and outputting the measured current values as the current values of the faulty samples; and comparing the current-value change rates of the measured current values corresponding to each address pair per address pair, and deciding whether a semiconductor device as a target test device to be tested is a good (non-defective) device or a faulty (defective) device based on the current-value change rates of the address pairs extracted based on the above comparison result.

In the semiconductor testing method of the present invention described above, the number of the semiconductor devices as the good samples is a plural number, and the current value and the current-value change rate of the good samples are output for each good sample, and the range of pass/fail decision criteria is determined based on the current-value change rates of the plural good samples.

In addition, the semiconductor testing method of the present invention described above further comprises the steps of: supplying the plurality of test vectors to semiconductor devices as faulty samples, and measuring current values output from these semiconductor devices corresponding to the address pairs, and outputting the current values of the faulty samples; calculating a change rate between the two current values in the above current values corresponding to each address pair, and outputting the calculated results as current-value change rates of the faulty samples; and comparing the current-value change rates of the faulty samples with the range of pass/fail decision criteria per address pair, and extracting effective address pairs, to be effectively used for the pass/fail decision, from the plural address pairs corresponding to the current-value change rates that are out of the range of pass/fail decision criteria, in the above semiconductor testing method, the step of measuring current values of the target test device is the step of measuring the current values by supplying the test vectors corresponding to the extracted effective address pairs for the pas/fail decision to the semiconductor device as the target test device.

Furthermore, in the semiconductor testing method of the present invention, the number of the semiconductor devices as the faulty samples are a plural number, and the current values and the current-value change rates of the faulty samples are output per faulty sample. The semiconductor testing method further comprises the steps of comparing the current-value change rates obtained from the plural faulty samples with the range of pass/fail decision criteria per address pair; and extracting the address pair group as an effective combination to be effectively used for the pass/fail decision from the plural address pairs corresponding to the current-value change rates of the faulty samples that are out of the pass/fail decision criteria, according to the number of the faulty samples. In the above method, the step of measuring the current values of the target test device is the step of supplying the test vectors corresponding to the effective address pairs to be effectively used for the pass/fail decision to the semiconductor device as the target test device.

Moreover, in accordance with another preferred of the present invention, a program with which a semiconductor testing method is executed by a computer in a semiconductor testing apparatus which comprises: a read circuit for reading measurement data including test vectors; a measurement circuit for supplying the test vectors to a semiconductor device and for measuring current values output from the semiconductor device; and a decision circuit for deciding whether a semiconductor device as a target test device is a good device (non-defective device) or it is a defective device based on the current values. The program comprises the procedures of; inputting a plurality of test vectors to semiconductor devices as good (non-defective) samples, and measuring a current value corresponding to an address of each test vector output from the good sample, and outputting the measured current values as the current values of the good samples; calculating a current-value change rate between two current values corresponding to an address pair forming two different addresses, and outputting the calculated current-value change rates as the current-value change rates of the good samples; determining a range of pass/fail decision criteria to be used for the criteria of the pass/fail decision whether a target test device to be tested is a good sample or a fault sample per address pair based on the current-value change rates of the good samples; supplying the plurality of the test vectors to semiconductor device as faulty samples, and measuring current values output from the semiconductor devices as the faulty samples corresponding to the addresses, and outputting the measured current values as the current values of the faulty samples; calculating a current-value change rate of the two current values corresponding to each address pair, and outputting current-value change rates as the current-value change rates of the faulty samples; and comparing the current-value change rate of the faulty samples with the range of pass/fail decision criteria per address pair, and deciding whether the semiconductor devices as the target test device is a good sample or a faulty sample based on the above comparison results.

According to the program of the present invention, it is possible to execute the semiconductor testing method described above to detect defects, that can not be detected by any conventional semiconductor testing method, with a high throughput in the semiconductor testing apparatus with a general purpose computer.

In the program of the present invention for executing the semiconductor testing method, the number of the semiconductor devices as the good samples is a plural number, the current values and the current-value change rates of the good samples are output per good sample, and the range of pass/fail decision criteria is determined based on the current-value change rates of the good samples.

Furthermore, the program of the present invention for executing the semiconductor testing method, further comprises the procedures of: supplying the plurality of the test vectors to semiconductor devices as faulty samples, and measuring current values output from the above semiconductor devices corresponding to the addresses of the test vectors, and outputting the measured current values as the current values of the faulty samples; and calculating a current-value change rate of the two current values corresponding to each address pair, and outputting the calculated results as the current-value change rates of the faulty samples; and comparing the current-value change rates of the faulty samples with the range of pass/fail decision criteria per address pair, and extracting effective address pairs, to be effectively used for the pass/fail decision, from the plural address pairs corresponding to the current-value change rates that are out of the range of pass/fail decision criteria. In the program, the step of measuring the current values of the target test device is the step of supplying the test vectors corresponding to the above extracted effective test vectors to the semiconductor device as the target test device.

Moreover, in the above-described program of the present invention, the number of the semiconductor devices as the faulty samples is a plural number, and the current values and the current-value change rates of the faulty samples are output per faulty sample; the above program for executing the semiconductor testing method further comprises the following procedures: the procedure of comparing the current-value change rates obtained from the plural faulty samples with the range of pass/fail decision criteria per address pair; and the procedure of extracting the address pairs to be effectively used for the pass/fail decision from the plural address pairs corresponding to the current-value change rates of the faulty samples that are out of the pass/fail decision criteria, according to the number of the faulty samples. In the program, the procedure of measuring the current values of the target test device is the procedure of supplying the test vectors corresponding to the extracted effective address pairs to the semiconductor device as the target test device.

In accordance with another preferred embodiment of the present invention, a semiconductor testing method of specifying a faulty part in a semiconductor product, comprises the steps of: supplying a plurality of test vectors to good and faulty samples as semiconductor devices, and measuring current values corresponding to addresses indicating the test vectors; calculating current-value change rates between current values corresponding to an address pair consisting of two addresses in each of the good and faulty samples; and comparing the current-value change rates corresponding to the address pairs in each of the good and faulty samples, and determining address pairs of the test vectors to be used for performing an emission analysis that is useful to specify a faulty part in a semiconductor device.

Moreover, the semiconductor testing method of specifying a faulty part in a semiconductor product of the present invention, further comprises the steps of: performing an emission analysis for each of the good and faulty samples by using the test vectors obtained in the steps of determining the address pairs of the test vectors to be used for performing the emission analysis; and specifying a faulty part by comparing emission patterns from the good sample with emission patterns from the faulty sample that have been obtained in the above emission analysis step.

Furthermore, in the emission analysis step in the semiconductor testing method of specifying a faulty part in a semiconductor product according to the present invention, different test vectors are supplied to each of the good and faulty samples in order to obtain emission patterns by changing the current values output from these samples, and in the faulty part specifying step, the faulty part is specified by obtaining a difference of the change of the emission patterns in each of the good and faulty samples.

Moreover, the semiconductor testing method of specifying a faulty part in a semiconductor product according to the present invention, further comprises the step of comparing the change of the emission parts in the good and faulty samples. In the faulty part specifying step in the above method, the emission area and the change of the emission area that do not occur in the good sample are detected and thereby the emission that is unique to the faulty sample is decided as the faulty part relating to the defeat.

Furthermore, in the step of calculating the current-value change rate in the above semiconductor testing method according to the present invention, two test vectors designated by two addresses are combined as an address pair, the range of the current-value change rates in the good and faulty samples are obtained according to the current-value change rates calculated by comparing the current values in optional number of the address pairs or in the test vectors in all the address pairs in each of the good and faulty samples.

Moreover, in the semiconductor testing method of the present invention, the current-value change rate between the test vectors per address pair in the faulty sample is compared with the current-value change rate between the test vectors in each address pair in the good sample, and the test vector pairs in the condition that the current-value change rate obtained from the faulty sample is out of the range of the current-value change rate obtained from the faulty sample are searched, and these test vector pairs are decided as the test vector group to be used for the emission measurement, and the test vector group is extracted as the address pairs of the test vectors that are used for specifying a faulty part in a semiconductor device.

In accordance with another preferred embodiment of the present invention, a semiconductor testing apparatus for specifying a faulty part in a semiconductor device, comprises: a current-value change measuring circuit for supplying a plurality of test vectors to good and faulty samples as semiconductor devices, and for measuring a current value corresponding to each test vector; a current-value change rate calculation circuit for calculating a current-value change rate per test vector pair in each of the good and faulty samples, the number of the test vector pairs being a desired number, by using the current values from the current-value measuring circuit; an emission measurement address pair determination circuit for comparing the current-value change rates in each test vector pair in each of the good and faulty samples obtained by the current-value change rate calculation circuit, and for determining test vectors to be used in an emission analysis based on the comparison results; an emission analysis circuit for performing the emission analysis using the test vectors determined above in each of the good and faulty samples; and a faulty part determination circuit for comparing emission patterns of the good and faulty samples, and for specifying a faulty part in a semiconductor device based on the result of the emission pattern comparison.

In the semiconductor testing method and the semiconductor testing apparatus according to the present invention described above, during the faulty analysis, the measurement data of current-values measured by using a plurality of test vectors of good (non-defective) and faulty samples, specifically that are returned from customers are calculated and then stored (into a memory device, for example), and the change rates of the stored current values between test vectors (namely, a test vector pair) are calculated in each of good and faulty samples. The current-value change rate in each test vector in the semiconductor device as the good sample is obtained based on the above calculated change rates, and then the current-value change rate in each faulty sample is compared with the range of the current-value change rate of the good sample per test vector pair. When the current-value change rate of the faulty sample is out of the range of the current-value change rate of the good sample, the test vector pair is extracted as the effective test vector group that is effectively use for specifying a faulty part. In the faulty part specifying process, the change of the emission part in the good sample using extracted test vectors is detected. By using the same test vector pairs described above, the emission parts in the faulty sample before and after the change of the current value is then compared in order to specify the change part in emission that does not occur in the good sample, but, that occurs in the faulty sample. This specified change part can be used for analyzing the cause of the defect in the faulty sample.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 3A shows the test vectors the name of which is AAA and FIG. 3B shows the test vectors the name of which is BBB;

FIG. 4 is a diagram showing results of IDDQ testing for passed (non-defective) samples PA, PB, and PC using plural test vectors in the semiconductor testing method shown in FIGS. 1 and 2;

FIG. 5 is a diagram showing results of IDDQ testing for the faulty samples FA, FB, and FC using plural test vectors in the semiconductor testing method shown in FIGS. 1 and 2;

FIG. 7 is a diagram showing a definition of a change rate of a current value;

FIG. 8 is a flow chart showing a calculation method of calculating the change rate of a current value;

FIG. 9 is a diagram showing each change rate of a current value in passed samples PA, PB, and PC;

FIG. 11 is a diagram showing one example of the change rate of a current value in faulty samples FA, FB, and FC;

FIG. 15A shows the test vectors the name of which is AAA, and FIG. 15B shows the test vectors the name of which is BBB;

FIG. 16 is a diagram showing the detailed results of measurement when plural test vectors are used in the fault part specifying method shown in FIG. 14;

FIG. 18 is a diagram showing a definition of the change rate of a current value to be calculated based on the faulty part specifying method shown in FIG. 14;

FIG. 19 is a diagram showing a detailed procedure to calculate the change rate of a current value in the faulty part specifying method shown in FIG. 14;

FIGS. 20A and 20B are diagrams showing comparison results of the change rates of current values in the passed and faulty samples using test vector pairs measured by the faulty part specifying method shown in FIG. 14;

FIGS. 25A and 25B are diagrams showing the change part in the emission images of the faulty sample, and FIG. 25C is a diagram showing an example of the change part detected only in the faulty sample based on the emission images measured by the faulty part specifying method shown in FIG. 14;

DESCRIPTION OF THE PREFERRED EMBODIMENTS

Other features of this invention will become apparent through the following description of preferred embodiments which are given for illustration of the invention and are not intended to be limiting thereof.

First Embodiment

A Preferred Embodiment of the Semiconductor Testing Method

A preferred embodiment of the semiconductor testing method of the present invention will be explained with reference to diagrams.

One feature of the preferred embodiment is to increase the detection rate to detect defects involved in a semiconductor device by using a change rate between current values corresponding to different test vectors as a pass/fail decision criteria. (That is, a passed device (sample) means that it is within a manufacture's tolerance level and may be sold to a customer, and a faulty device (sample) means that it is not within the manufacture's tolerance level and cannot be sold to any customer or it has returned from the customer after sold because the defect exists therein.)

Another feature of the preferred embodiment is to increase a throughput in the IDDQ testing by extracting effective test vectors for a mass production testing and by eliminating ineffective test vectors that are not capable of detecting defects for the mass production testing based on the IDDQ measuring using plural test vectors for each of the passed and faulty samples.

First, a guideline of the semiconductor testing method of the first embodiment will be explained with reference to FIGS. 1 and 2.

Figure 1:
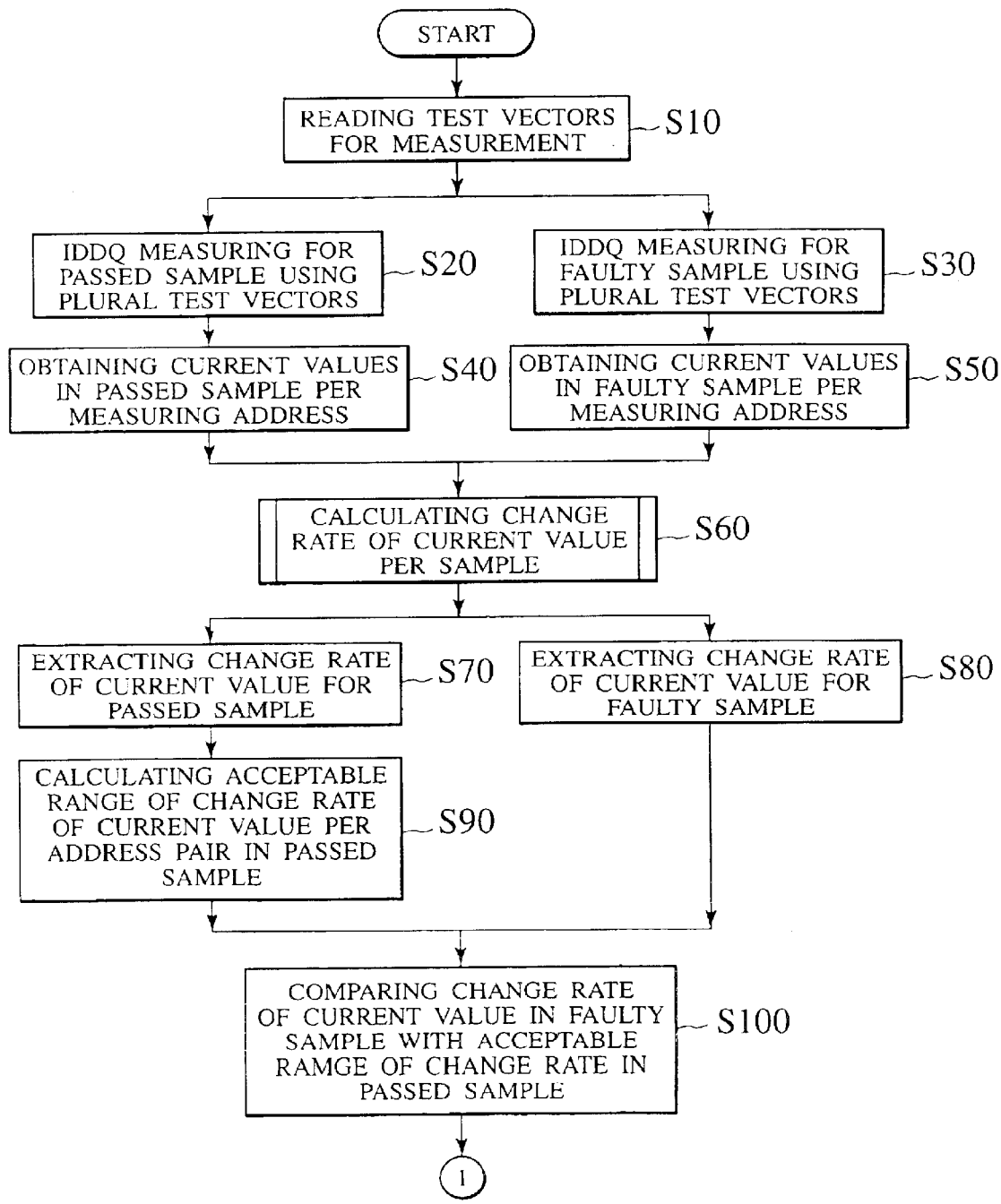
FIG. 1 is a flow chart showing a semiconductor testing method for semiconductor devices according to the first embodiment of the present invention.

As shown in FIG. 1, data items that are necessary to perform the measurement of the semiconductor testing method are red (Step S10). The data items for the measurement are one or more existing test programs, test vectors, data (such as sample names) about passed and fault samples that have been prepared in advance.

Following this step, the IDDQ measurement is performed for the passed and faulty samples by using a current value measurement device (Steps S20 and S30) in order to obtain a measurement result (as a current value) corresponding to each address indicating each test vector (Steps S40 and S50).

Next, a current-value change rate corresponding to each measurement addresses pair (namely, each pair is called to as a test vector pair) is calculated per sample based on the measurement results (Step S60) in order to extract the current-value change rate (as a first current-value change rate) in the passed samples and the current-value change rate (as a third current-value change rate) in the faulty sample (Steps S70 and S80).

Following this, the maximum and minimum values of the change rat of the current value of the passed sample are extracted per address pair from the data of the current-value change rates in the passed sample. Then, the range of the change rat that is acceptable for the passed samples is obtained (Step S90).

Next, the current-value change rate in the faulty sample is compared with the range of the change rate in the passed sample per address (Step S100).

Figure 2:
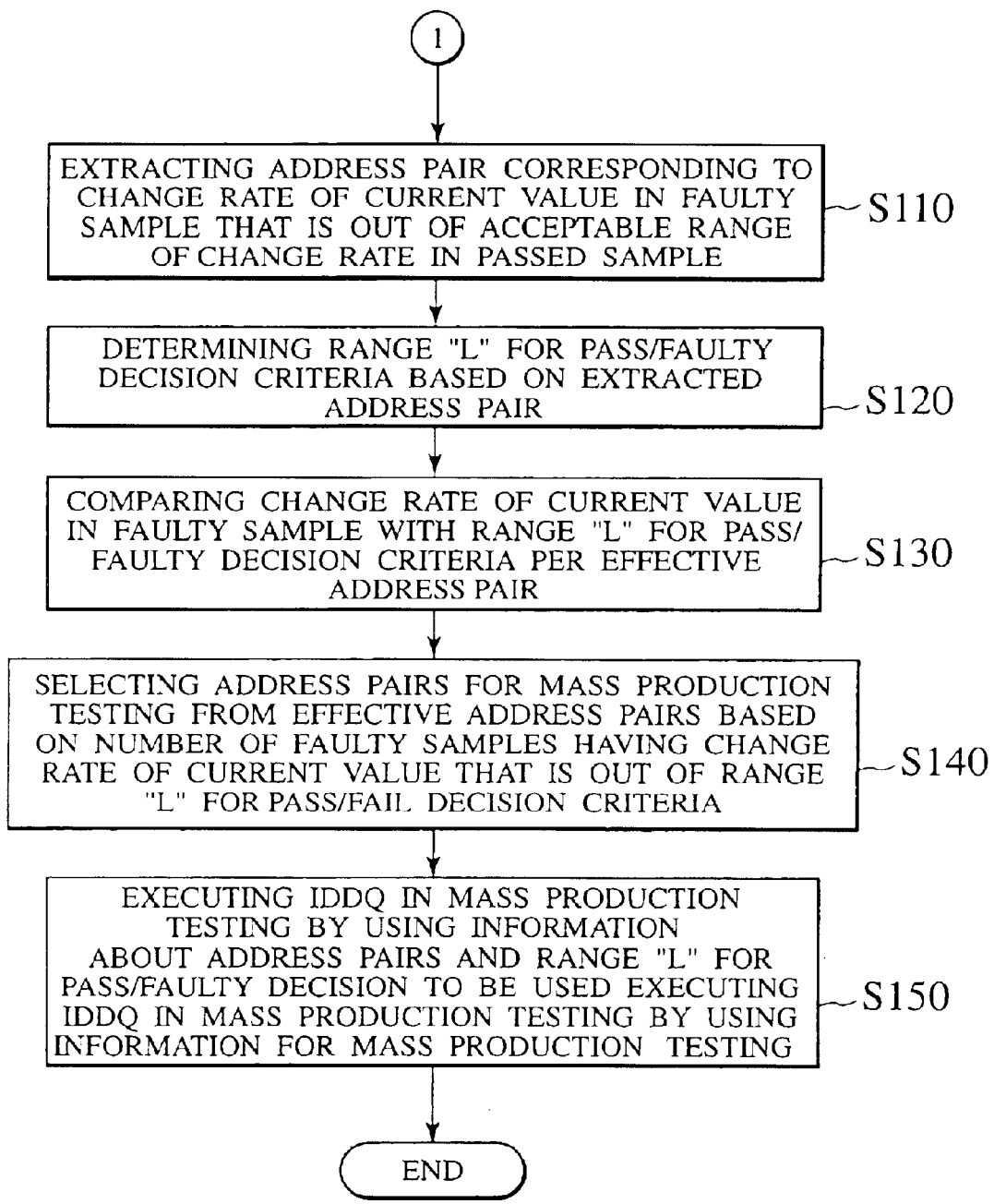
FIG. 2 is a flow chart showing the semiconductor testing method for semiconductor devices according to the first embodiment of the present invention.

Next, as shown in FIG. 2, based on the comparison results, the address pairs corresponding to the current-value change rate in the faulty sample that is in excess of the range of the change rate of the passed sample are extracted in order to obtain the effective address pairs for the faulty detection (hereinafter, referred to as an effective address pair) (Step S110).

Next, the range "L" of pass/fail decision criteria in a mass production testing is determined per extracted effective address pair based on the range of the change rate in the passed sample (Step S120).

Next, the current-value change rate in the faulty sample is compared with the range "L" of pass/fail decision criteria (Step S130). Then, address pairs for the mass production testing are selected from the effective address pairs based on the number of the faulty samples, each faulty sample having the current-value change rate that is in excess of the range "L" of pass/fail decision criteria, according to a required specification (Step S140).

Finally, the IDDQ measurement in the IDDQ testing is performed by using the information of the address pairs for the mass production testing and the range "L" of pass/fail decision criteria (Step S150).

These procedures described above will be explained concretely with reference to diagrams.

Figure 3A:
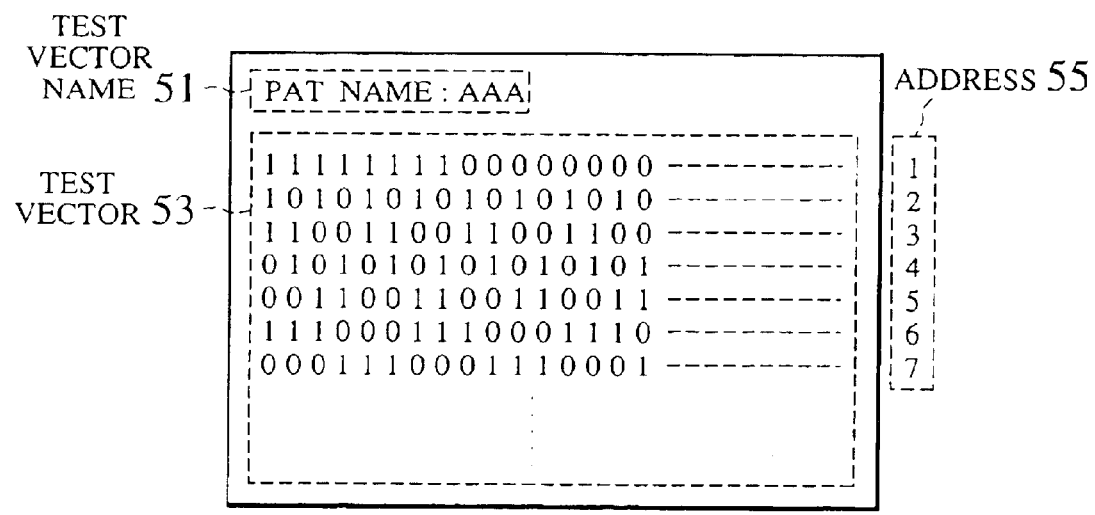
FIGS. 3A and 3B are diagrams showing explanation for test vectors.
Figure 3B:
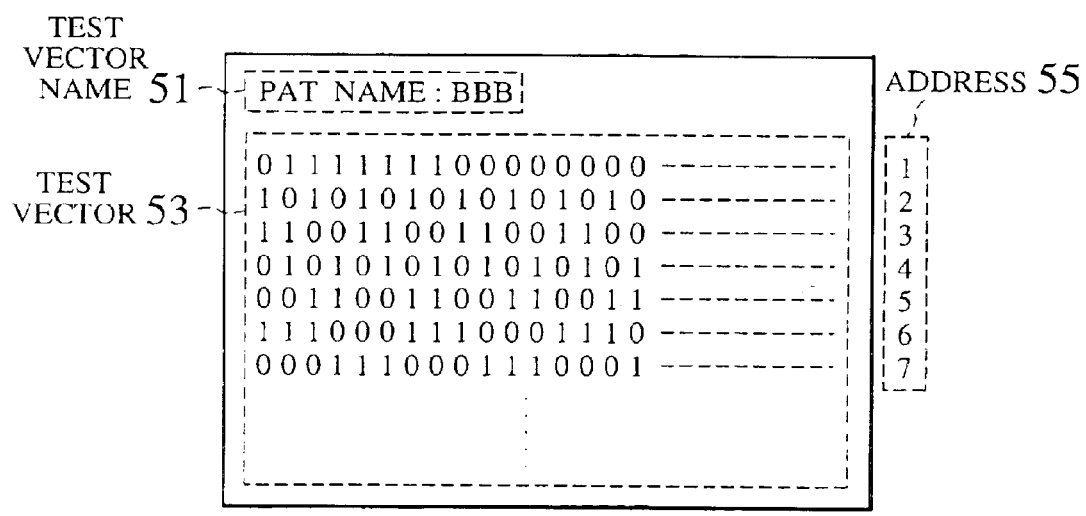

First, a description will be given of the explanation for information of test vectors, that are usually used, with reference to FIGS. 3A and 3B.

The test vector information includes the test vector (group) name 51, the test vectors 53 consisting of an input signal group and an output signal group. FIG. 3A shows one example of the information of the test vectors the name of which is "AAA". FIG. 3B shows one example of the information of the test vectors the name of which is "BBB". Each test vector is selected by each corresponding address 55 (that is also called to as a step or a cycle).

When a target device is detected by using plural test vectors (namely, that are designated by corresponding plural addresses), it is acceptable to select addresses (namely, test vectors) from the plural addresses at random or according to a desired order, and use the selected addresses. However, in order to select the addresses with a high reliability, it is desired to select plural test vectors as many as possible. Because the output signal group means signals of expected values in a logical testing, the following explanation uses only the input signal group in the test vectors 53.

FIGS. 4 and 5 shows concrete examples of measurement results obtained by using these test vectors (as the first number test vectors). FIG. 4 shows the measurement results obtained from the three passed samples PA, PB, and PC. FIG. 5 shows the measurement results obtained from the three faulty samples FA, FB, and FC. Where, these passed samples are within a manufacture's tolerance level and can be sold to a customer.

On the other hand, these faulty samples are not within the manufacture's tolerance level and cannot be sold to any customers.

As shown in both FIGS. 4 and 5, the measurement using the plural address (test vectors) obtains pattern name (PAT), address numbers (ADR), and a current value (IDDQ) corresponding to each address every sample.

Figure 6A:
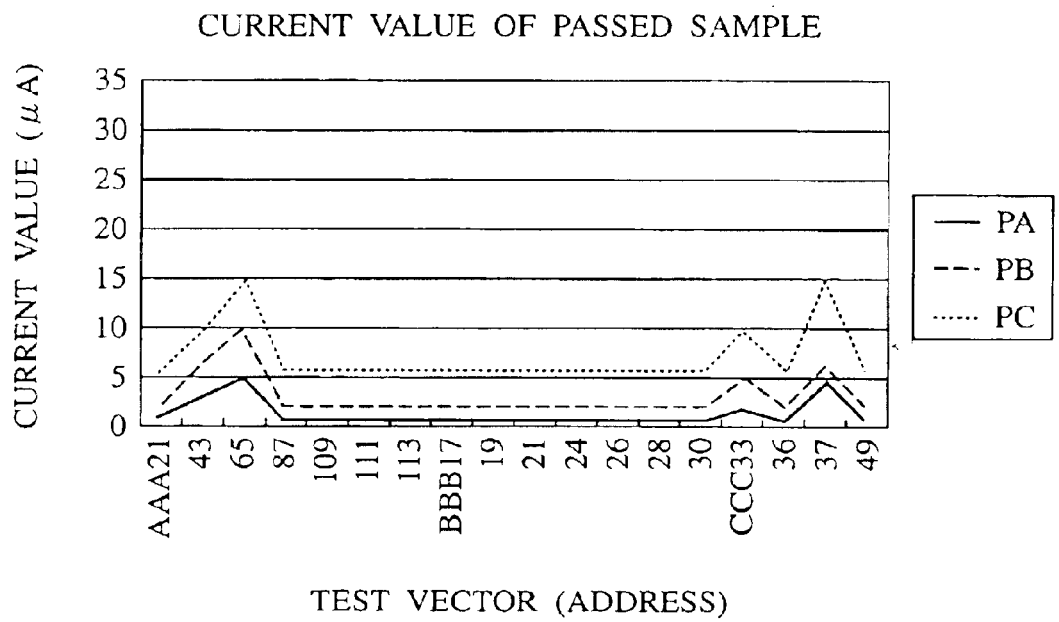
FIGS. 6A and 6B are diagrams each diagram showing the relationship among current values obtained in the IDDQ measurement using plural test vectors with these test vectors.
Figure 6B:
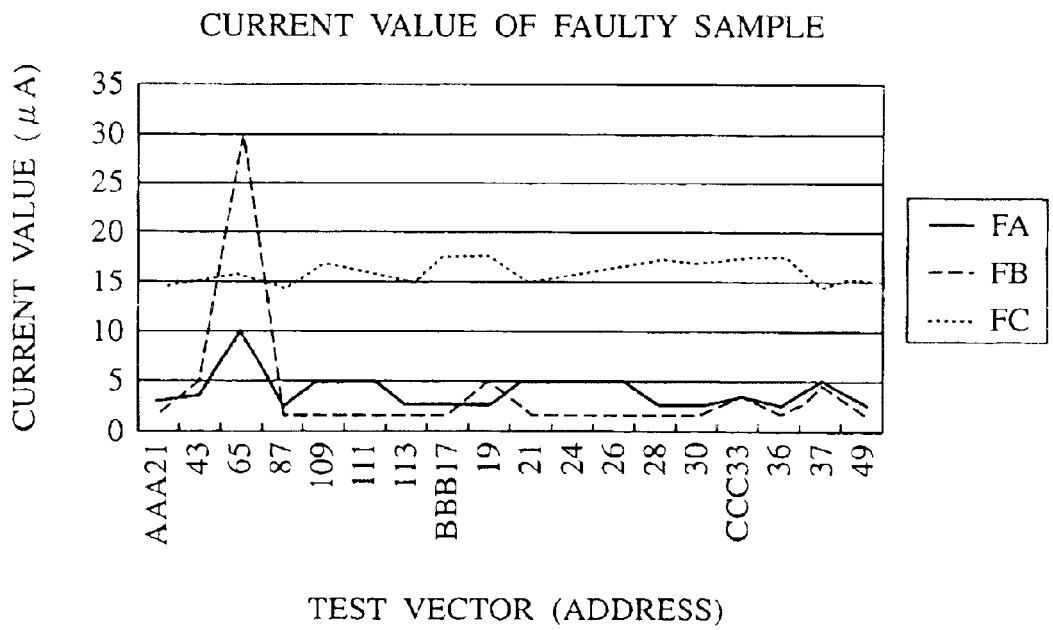

FIGS. 6A and 6B are diagrams showing the relationship between continuous addresses and corresponding current values in a visual form based on the information of the measurement results shown in both FIGS. 4 and 5. In particularly, FIG. 6A shows the relationship among the passed samples PA, PB, and PC and the corresponding current values, and FIG. 6B shows the relationship among the faulty samples FA, FB, and FC and the corresponding current values.

As clearly shown in comparison between FIGS. 6A and 6B, the current values of the faulty samples enter the unstable state where there are large current values and unstable current values. On the contrary, the passed samples in the same zone enter the stable state, see ADR87 of the test vector AAA to ADR30 in the test vector BBB in FIG. 6A.

FIG. 7 shows one example of the concept of a current-value change rate to be used in the embodiment of the present invention.

The change rate means the degree of the change of the current value between two test vectors. In this embodiment, when current values measured corresponding to two addresses in each address pair are "a" and "b", respectively, the change rate "C" of the current value is defined by the following equation:

$$C=(b-a)/a, \text{ or } (a-b)/b.$$

However, it is also possible to define the current-value change rate based on other methods, for example, a differential value and the like according the kind of a target test device, a required specification.

Next, a description will be given of the procedure to calculate the current-value change rate according to the definition shown in FIG. 7, with reference to the flow chart shown in FIG. 8.

First, at Step S61, plural combinations of addresses, namely, plural address pairs are determined based on the data of a current value of each address measured by the IDDQ measurement (see Step S20 and S30 shown in FIG. 1).

Next, the measured current values "a" and "b" of each address pair are inserted into the equation shown in FIG. 7 (Step S62) in order to obtain the current-value change rate "C" per address pair (Step S63).

Next, a description will be given of the calculation method (see Step S90 shown in FIG. 1) of the range of the change rate in the passed samples.

FIG. 9 is a diagram showing the current-value change rate per address pair in the passed samples PA, PB, and PC shown in FIG. 4. The range criteria (or a standard of the range) shown in FIG. 9 shows that the range "Cp" of the change rate for the passed sample is Cs<Cp<Cl where the minimum value is "Cs" and Maximum value is "Cl" in the change rates corresponding to the same address pair in the passed samples PA, PB, and PC.

Here, it can be judged that the address pairs corresponding to the change rates that are within the range "Cp" of the change rate for the passed sample have a small possibility to detect any defects during a mass production testing.

Accordingly, the current-value change rate in the faulty sample and the range "Cp" of the change rate for the passed sample are compared per address pair (see Step S100 shown in FIG. 1) in order to extract the address pairs (as the first address pair group) corresponding to the change rates that are out of the range "Cp" (see Step S110 shown in FIG. 2). These extracted address pairs (as effective address pairs) have a higher detection function to detect defects.

After the selection of the effective address pairs, the range "L" of pass/fail decision criteria for the selected address pairs to be used during a mass production testing is determined (see Step S120 shown in FIG. 2).

Figures 10, 12:
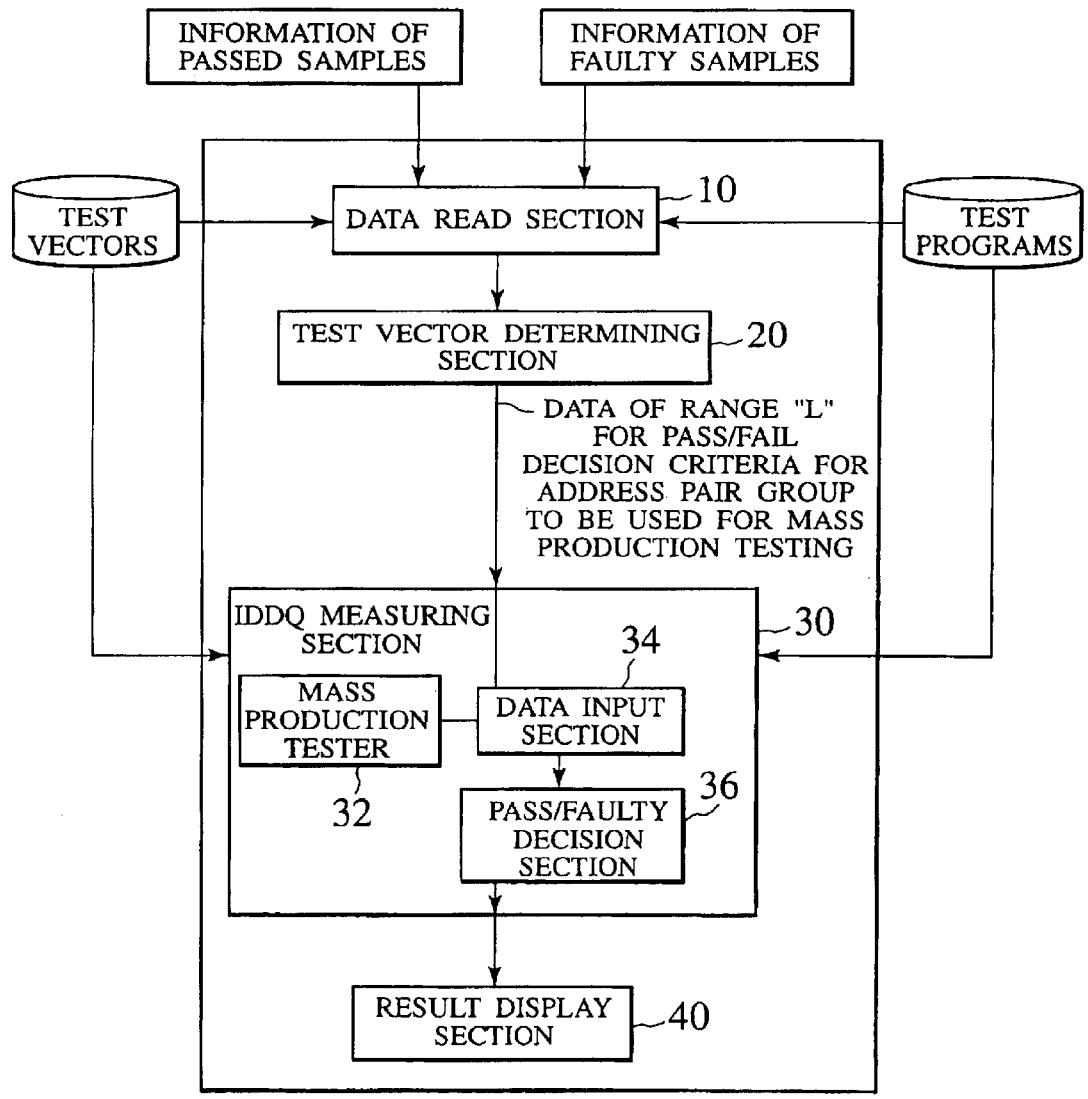
FIG. 10 is a diagram showing a definition of a range of a change rate criteria for judging whether it is a passed sample or a faulty sample.
FIG. 12 is a block diagram showing an example of the configuration of the semiconductor testing apparatus to execute the semiconductor testing method according to the first embodiment of the present invention.

FIG. 10 shows one example of the definition of the range "L" of pass/fail decision criteria for selecting the good sample (namely, the passed sample).

Because the mass production testing includes an error as a manufacture's tolerance level, the range "L" is determined in consideration of the error "α" by using the range ∂Cp" of the change rate in the passed sample calculated based on the current-value change rates. In this embodiment, the error a is defined as (Max. value Cl−Min. value Cs)/2.

Furthermore, according to this first embodiment, the range "L" of pass/fail decision criteria for deciding and selecting the passed sample defined above is compared with each current-value change rate in the faulty sample, so that, it is possible to further extract the effective test vectors according to a required specification.

FIG. 11 is a diagram showing the calculation results of the current-value change rate in the faulty samples corresponding to each address pair that have been used in the calculation for the passed samples shown in FIG. 9. FIG. 11 shows the calculated change rates of the current value in the faulty samples in the comparison to the range "L" of pass/fail decision criteria to be used for selecting the passed sample.

In the example shown in FIG. 11, because the current-value change rates between the addresses 21 and 43 in PAT=AAA and between the addresses 28 and 30 in PAT=BBB are within the range "L" of pass/fail decision criteria for deciding and selecting the passed sample, it can be understood that these addresses can not detect defeats during the mass production testing. Accordingly, these address pairs (21, 43 and 28, 30) are out of the first address pair group described above.

On the other hand, the current-value change rates, between the addresses 109 and 111 in PAT=AAA, between the address 113 in PAT=AAA and address 17 in PAT=BBB, between the addresses 17 and 19, the addresses 21 and 24, the addresses 24 and 26 in PAT=BBB, and between the addresses 36 and 37, and the addresses 37 and 49 in PAT=CCC are out of the range "L" of pass/fail decision criteria, and only one faulty sample becomes out of the range "L" in each of these address pair. Accordingly, the use of these address pairs can detect faulty semiconductor products like the above faulty sample during the mass production testing.

In addition, as shown in FIG. 11, the change rates of the current value, between the addresses 43 and 65, 65 and 87, 87 and 109, and 111 and 113 in PAT=AAA, between the addresses 26 and 28 in PAT=BBB, and between the address 30 in PAT=BBB and the address 33 in PAT=CCC, and between the addresses 33 and 36 in PAT=CCC are out of the range "L" of pass/fail decision criteria, and two faulty samples become out of the range "L" in each of these address pair. Accordingly, the use of these address pairs can detect faulty semiconductor products like the above two faulty samples during the mass production testing.

Further, as shown in FIG. 11, the current-value change rate between the addresses 19 and 21 in PAT=BBB are out of the range "L" of pass/fail decision criteria, and three faulty samples become out of the range "L" in this address pair (19 and 21). Accordingly, the use of this address pair can detect efficiently faulty semiconductor products corresponding to three faulty samples during the mass production testing.

As explained above, the detection possibility to detect a faulty sample is changed according to a combination of addresses (address pair). Therefore the address pair (namely, the combination of addresses) is selected as a third address pair group according to a required specification. During the mass production testing, the IDDQ measurement is then performed by using the information of the range "L" of pass/fail decision criteria after the selecting of the effective address pairs as the third address pair group (see Step S130 shown in FIG. 2). Thereby, it is possible to detect faulty devices including defects with a high throughput, that have not be detected by any conventional IDDQ measuring methods. Accordingly, it is possible to detect defects that are not be detected by the conventional testing, and possible to return the data about the detected defects as feedback information to a design section and a process section speedily. It is thereby possible to improve the defects of semiconductor devices speedily.

Further, because it is possible to combine the test vectors to be used for measurement, the testing time can be adjusted according to the required specification flexibility.

One Embodiment of the Semiconductor Testing Device

A description will be given of the configuration of the semiconductor testing device with reference to diagrams.

FIG. 12 is a block diagram showing the brief configuration of the semiconductor testing apparatus to execute the semiconductor testing method according to the first embodiment of the present invention.

The semiconductor testing device shown in FIG. 12 comprises a data input section 12, a test vector determining section 20 as a determining means, a IDDQ measurement section 30, a result display section 40. This testing device shown in FIG. 12 operates according to the semiconductor testing method of the present invention described above.

The data read section 10 inputs test programs, test vectors, and data about passed and faulty samples and then supplies these data to the test vector determining section 20.

Figure 13:
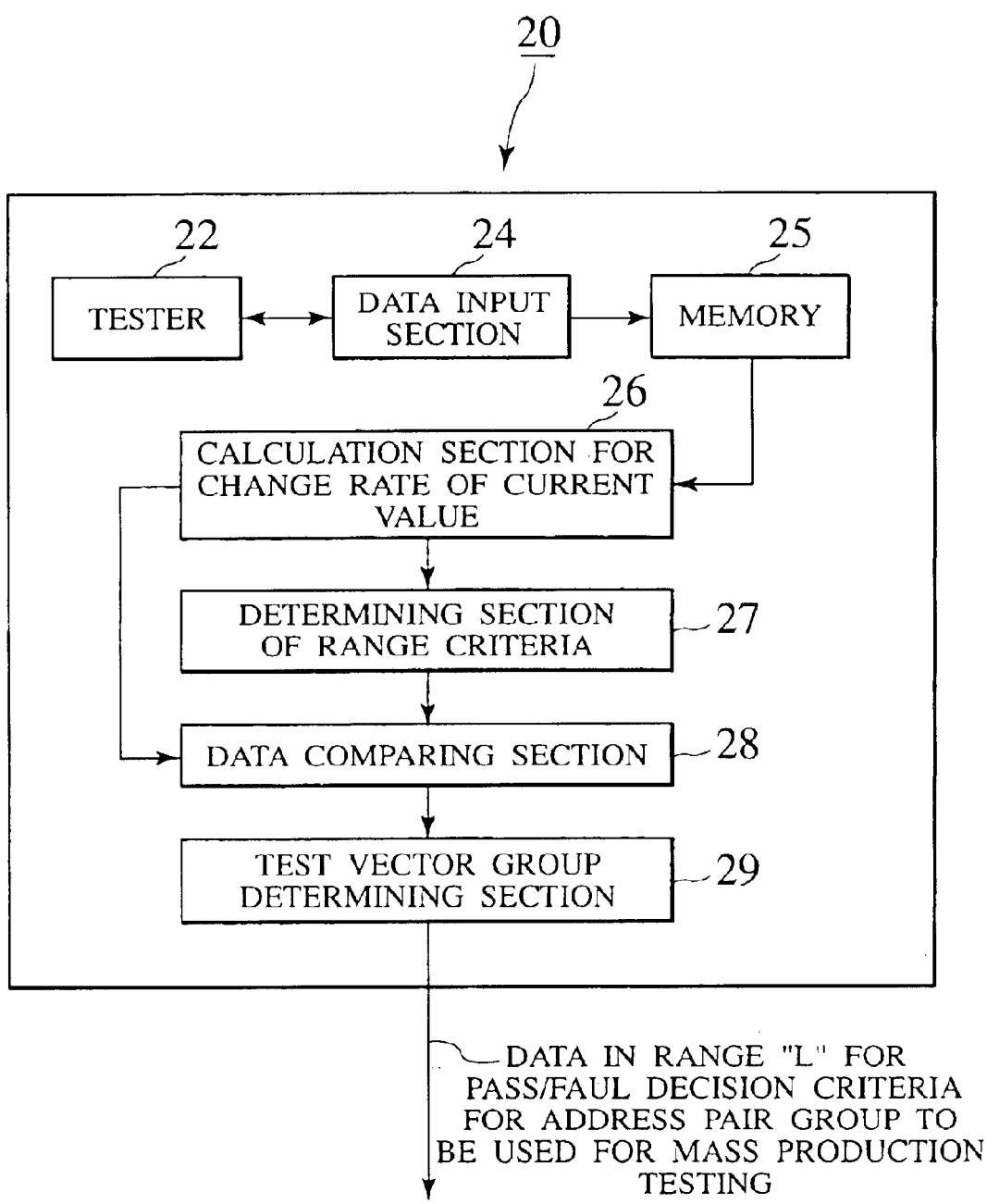
FIG. 13 is a block diagram showing an actual configuration of a test vector determining section in the semiconductor testing apparatus shown in FIG. 12.

FIG. 13 shows a detailed configuration of the test vector determining section 20. As shown in FIG. 13, the test vector determining section 20 comprises the data input section 24, a tester 22, a memory 25, a calculation section 26 for a current-value change rate, a determining section 27 of a range criteria, a data comparing section 28, and a test vector group determining section 29 as a measurement range determining section.

The data input section 24 inputs the test programs, the test vectors and the like from the data read section 10 and then performs the IDDQ measurement using the plural test vectors for the passed samples and the faulty samples that have been prepared by the tester 22 in advance.

The data input section 24 transfers current values that are corresponding to addresses of the test vectors as the measured data to the memory 25. The calculation section 26 for the change rate calculates reads the current values and the address of the test vectors and then calculates the current value per address pair in each of the passed and faulty samples, and transfers the calculation results of the passed samples to the determining section 27 of a range criteria, and also transfers the calculation results of the faulty samples to the data comparing section 28.

The determining section of the rang criteria 17 inputs the calculation results (namely, the change rates of the passed samples) from the calculation section 26 for the current-value change rate and then calculates the range "Cp" of the change rate in the passed samples and the rang "L" of pass/fail decision criteria and transfers them to the data comparing section 28.

The data comparing section 28 compares the change rate of the current value in the faulty samples with the range "L" of pass/fail decision criteria per address pair and then transfers the sample name and the address pairs that are out of the range "L" of pass/fail decision criteria to the test vector group determining section 29.

The test vector group determining section 29 extracts address pairs (namely, test vector pairs) based on the data provided from the data comparing section 28 so that the number of the faulty samples that are out of the range "L" of the pass/faulty decision criteria is increased as many as possible. The test vector group determining section 29 than extracts the searched address pairs as the address pair group to be used during the mass production testing and then outputs the extracted test vector pair group (as the first or second combination address pairs) and the range "L" of pass/fail decision criteria.

Return to FIG. 12, the IDDQ measuring section 30 comprises the mass production tester 32 and the data input section 34.

The data input section 34 inputs data about the test vector pair (address pair) group and the range "L" of pass/fail decision criteria from the test vector determining section 20, and outputs the address pair group to be used during the mass production testing to both the mass production tester 32 and the pass/faulty decision section 36, and also outputs the range "L" of pass/fail decision criteria to the pass/fail decision section 36.

The mass production tester 32 performs the IDDQ measurement for a target sample after the mass production based on the address pair group to be used for the mass production testing provided from the data input section 34 and outputs the measurement result to the data input section 34. The data input section comprising an arithmetic means calculates the current-value change rate per address pair for each target sample based on the results of the IDDQ measurement obtained from the mass production tester 32 and then outputs calculation results (as a second change rate of the current value) to the pass/fail decision section 36.

The pass/fail determining section 36 decides whether a target sample to be tested is good or faulty based on the change rate of the current value and the range "L" of pass/fail decision criteria supplied from the data input section 34. During the decision when the current-value change rate of the target sample is out of the range "L" of pass/fail decision criteria, it is decided that this target sample is a faulty sample. When out of the range "L", the pass/fail determining section 36 continues the decision operation for a following target sample.

The result display section 40 receives and then displays the decision results transferred from the pas/failure decision section 36 on a CRT (Cathode Ray Tube) or other display means.

Recording Medium for Recording the Testing Programs

The semiconductor testing method of the preferred embodiment described above can be also stored into a recording medium, for example, a floppy disk, or a CD-ROM as a program to be executed by the semiconductor testing apparatus as a computer system. Thereby, it is possible to realize the semiconductor testing method of the present invention by the testing apparatus with a general purpose computer such as a work station. The recording medium to store the testing program is not always a magnetic disk or an optical disk of a portable type, for example, it is possible to store it into the hard disk device or a memory of a fixed type. Further, the test program to execute the series of the procedures of the semiconductor testing method can be supplied through a communication network (including a wireless communication) such as internetworking environments. Moreover, it is also possible to supply the test program after modulated or compressed, or also to store the test program into a recording medium.

Second Embodiment

Figure 14:
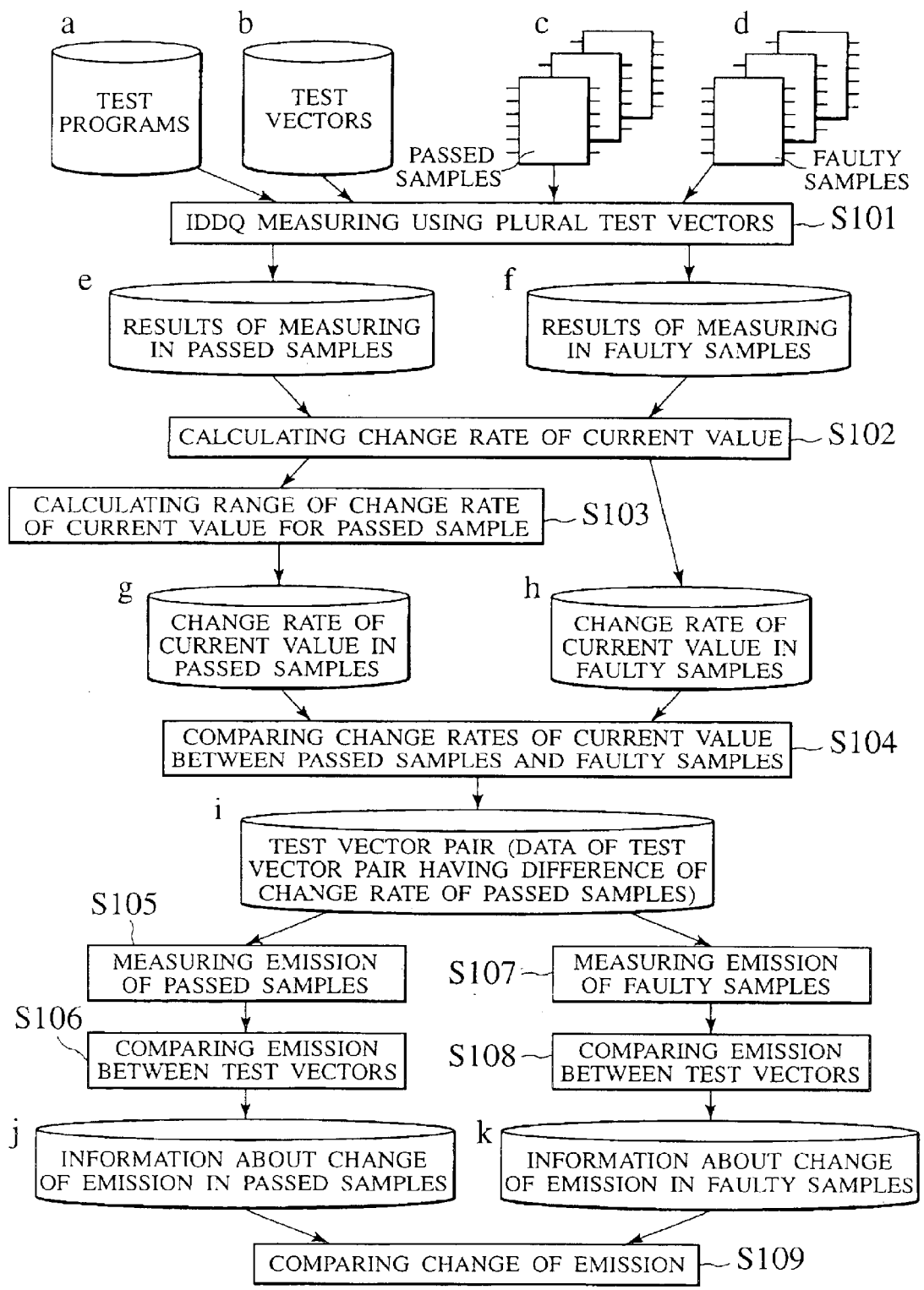
FIG. 14 is a flow chart showing a fault part specifying method as a semiconductor testing method according to the second embodiment of the present invention.

FIG. 14 is a flow chart to explain the op ration of the faulty part specifying method according to the preferred embodiment of the present invention. As shown in FIG. 14, this method performs the IDDQ measurement using the plural test vectors for each sample (as target samples), and obtains the range of the change rate in passed (good) samples based on optional test vector pairs, and then extracts the effective test vector pairs to be used during the emission measurement of a faulty sample to be analyzed.

A description will be given of the procedure of the faulty part specifying method as the semiconductor testing method of the present invention with reference to diagrams.

First, an operator prepares an existence test program "a", and test vectors "b" that are used for a conventional testing, specifically, a functional test, and passed samples "o" and one or more faulty samples "d" that are returned from a customer after shipped.

By using the above data and samples, the IDDQ measurement is performed according to the plural test vectors, at Step S101 shown in FIG. 14. The measurement results corresponding to the passed samples and the faulty samples are stored as information "e" and "f" into the memories.

Figure 15A:
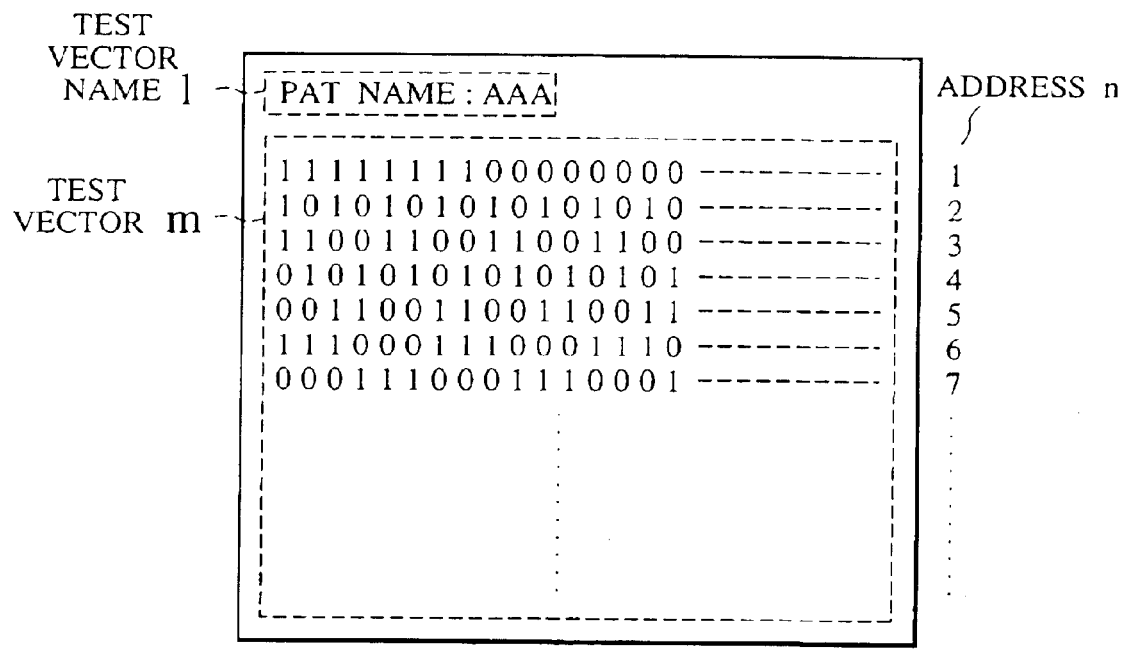
FIGS. 15A and 15B are diagrams each showing test vectors to be used during the execution of the fault part specifying method shown in FIG. 14.
Figure 15B:
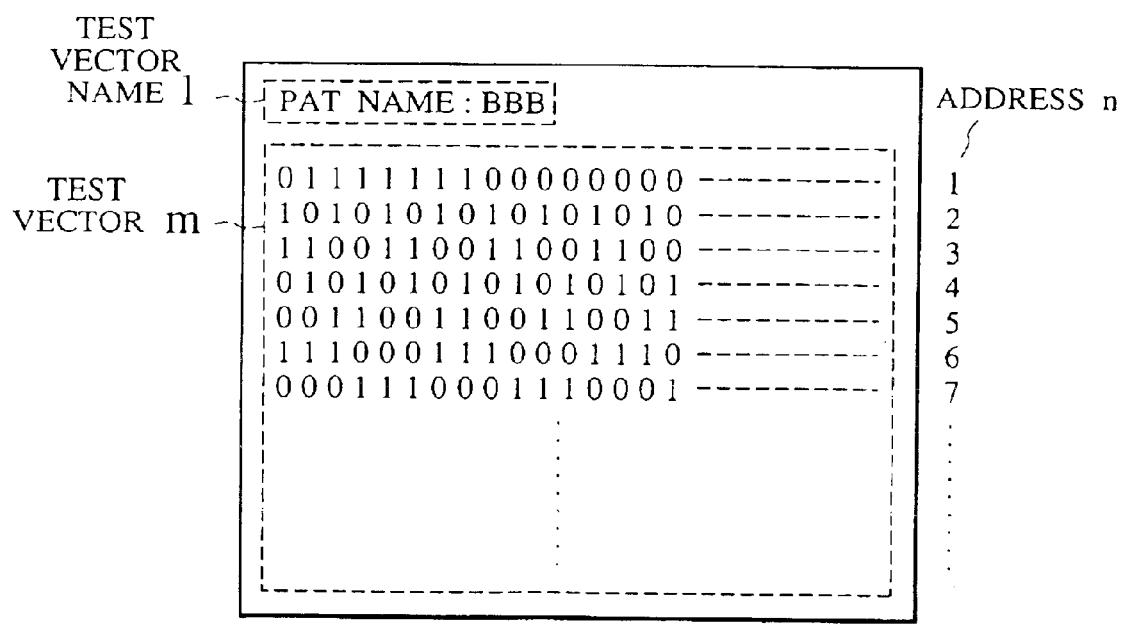

FIG. 15 shows an example of information about the test vectors. In the information of the test vectors, the test vector name "l", input/output pattern "m" (input signal group (test vectors), output signal group) are described. These signal groups are addressed by the number "n" of an address. This number is also called to only as an address (or a step, or a cycle, and the like).

In the measurement using a plurality of test vectors, these test vectors are randomly selected, or selected based on a desired method. In this embodiment, the measurement using plural test vectors as many as possible can obtain effective test vectors during the measurement analysis.

Next, based on the results "e" and "f" of the measurement, the current-value change rate is calculated per test vector pair (Step S102). As apparently shown in FIG. 16, the information about the test vectors, addresses, current values are obtained per sample name (PA to PC, and FA to FC) as the results of the IDDQ measurement.

Figure 17A:
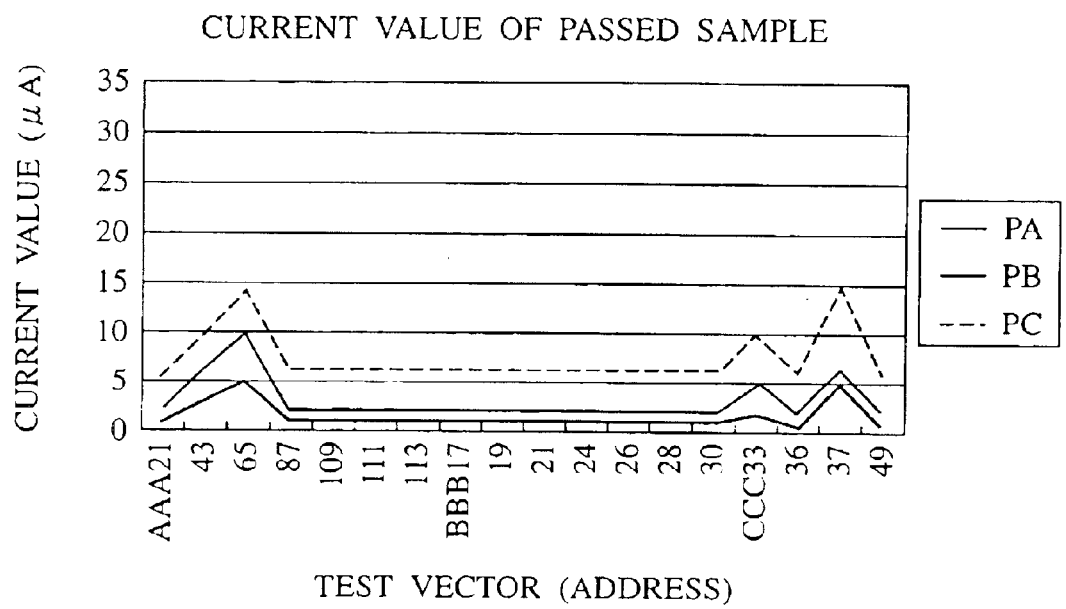
FIGS. 17A and 17B are diagrams each showing the relationship among the current values obtained by the IDDQ measurement using plural test vectors with these test vectors in the fault part specifying method shown in FIG. 14.
Figure 17B:
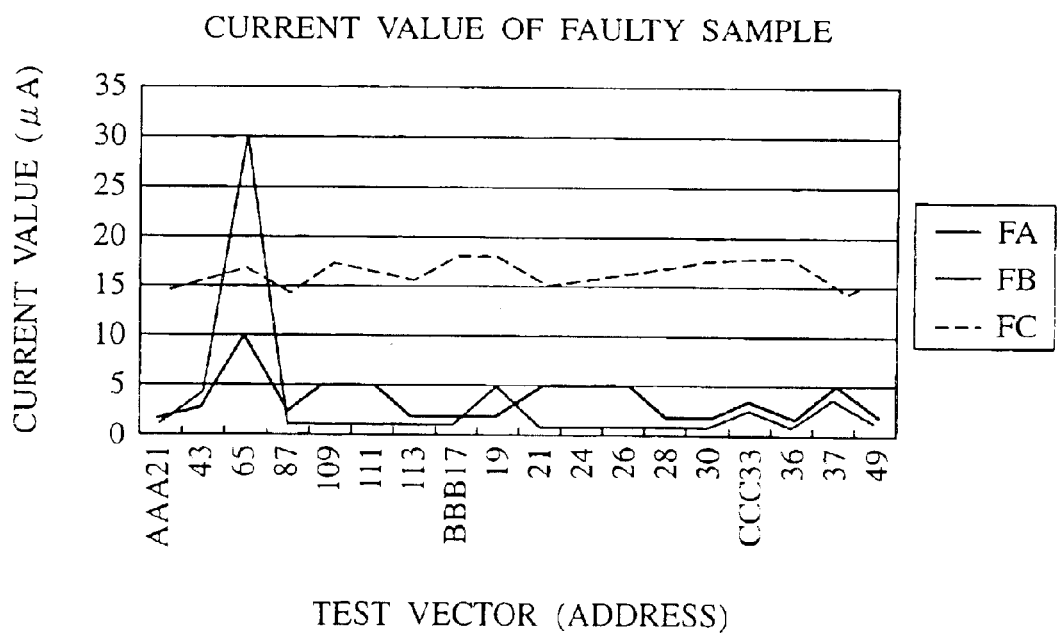

Based on the information, the current-value change rate is obtained as shown in FIGS. 17A and 17B. In both FIGS. 17A and 17B, there are large values of the change rate in the faulty samples corresponding to the stable zone in the passed samples.

FIG. 18 shows the basic concept of the change rate to be used in the present invention. The change rate means a magnitude of a difference between two addresses (namely, an address pair). In this embodiment, the current-value change rate "C" is defined by "(b−a)/a" or "(a−b)/b" where a current value corresponding to one address is "a" and a current value corresponding to the other address is "b". The present invention is not limited by this definition, that is, it is acceptable to use a value showing the change of the current value between two addresses (namely, between two test vectors), for example, a difference value between two current values corresponding to only two addresses or another definition.

Next, a description will be given of the calculation of the current-value change rate with reference to the flow chart shown in FIG. 19.

First, an optional address pair is determined based on the current value of each address (indicating each test vector) obtained during the IDDQ measurement using plural test vectors (Step S201).

Next, the data "a" and "b" of the current values obtained by the measurement are inserted to the equation shown in FIG. 18 (Step S202) in order to calculate the current-value change rate "h" in the faulty sample.

Here, the current process is returned to the flow chart shown in FIG. 14, at Step S103, the range "g" of the current-value change rates in the passed samples. As shown in FIG. 18, the range "C" of the current-value change rate in the passed sample becomes Cs<C<Cl when the minimum value in the change rates obtained by the same address pair in the passed samples is "Cs" and the maximum value is "Cl".

Next, the current-value change rates "g" and "h" of both the passed and faulty samples are compared, and address (test vector) pairs having a difference when compared with the change rate of the passed sample are extracted. Thereby, the extracted test vector pairs becomes effective test vector pairs for the emission measurement (Step S104).

FIG. 20A shows an example of the current-value change rate between two addresses (indicating a test vector pair) and the minimum change rate and the maximum change rate among the passed samples PA, PB, and PC. In FIG. 20A, the range of the change rate in the passed samples are not less than the minimum value and not more than the maximum value.

FIG. 20B is a diagram showing a difference of the change rate of each faulty sample from the range of the current-value change rate in the passed samples shown in FIG. 20A. FIG. 20B shows whether the change rate at each address pair in each faulty sample is out of the range of the change rate of the passed samples.

In addition, there are other methods to select effective test vectors, for example, it is possible to use an address pair (a test vector pair) having a change rate of the faulty sample that is more than the change rate of zero in the passed sample, or an address pair (a test vector pair) having a change rate of the faulty sample that is more difference from the change rate of the passed sample.

In the example shown in FIGS. 20A and 20B, the effective address pairs (effective test vector pairs) to be used for the emission measurement can be determined as follows:

About the faulty sample FA, Addresses 87 and 109, and 111 and 113 in PAT=AAA and Addresses 19 and 21, and 26 and 28 in PAT=BBB in the change rate of zero of the passed sample; and Addresses 43 and 65 in PAT=AAA in the change rates of other than zero in the passed sample.

All the faulty samples FA, FB, and FC are within the range of the change rate of the current value in the passed sample in following addresses:

Addresses 21 and 43 in PAT=AAA, and Addresses 28 and 330 in PAT=BBB.

The two faulty samples are out of the range of the change rate of the current value of the passed sample in the following addresses:

Addresses 43 and 65, 65 and 87, 87 and 109, 111 and 113 in PAT=AAA, Addresses 26 and 28 in PAT=BBB, 30 in PAT=BBB and 33 in PAT=CCC, and Addresses 33 and 36 in PAT=CCC.

ALL the three faulty samples FA, FB, and FC are out of the range in the addresses 19 and 21 in PAT=BBB.

Next, the emission measurement is performed for each passed and faulty sample in the address pair "i" for measurement extracted by comparing the current-value change rates of the faulty sample to be analyzed with that of the passed sample (Steps S105 and S107).

Figure 21A:
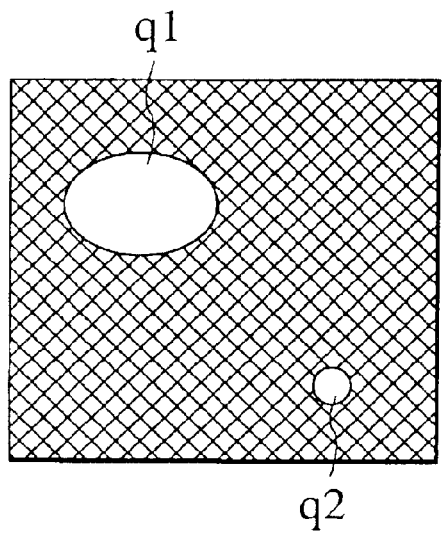
FIGS. 21A and 21B are diagrams showing an example of emission images as the emission measurement results of the passed sample corresponding to each test vector in the test vector pair extracted by the faulty part specifying method shown in FIG. 14.
Figure 21B:
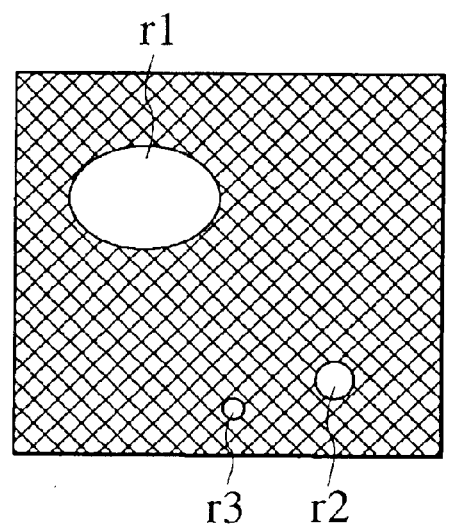

First, the emission images of the passed samples are obtained per test vector pair "i", as shown in FIGS. 21A and 21B.

FIG. 21A shows an example of the emission image in the passed sample before the change of the current value supplied to the passed sample. FIG. 21B shows an example of the emission image in the passed sample after the change of the current value. Where, the change of the current value is performed by switching the test vector in the test vectors shown in FIGS. 15A and 15B.

Next, the difference of the positions where the emission occurs is detected based on the images shown in FIGS. 21A and 21B in order to check the change of the emission positions.

Figure 22:
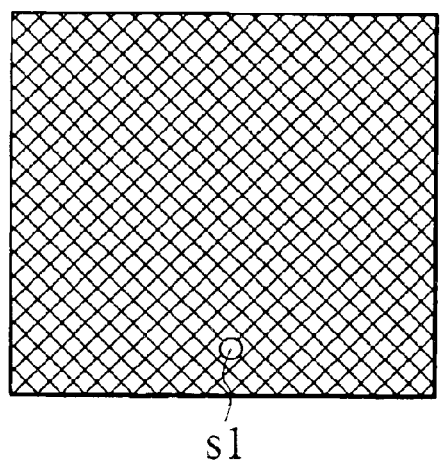
FIG. 22 is a diagram showing a changed part in the emission images measured by the faulty part specifying method shown in FIG. 14.

FIG. 22 shows the comparison result of the emission positions before and after the change of the current value in the passed sample. In FIG. 22, the position "s1" (also "r3" in FIG. 21B) indicates the emission area that has been changed after the change of the current value.

Figure 23A:
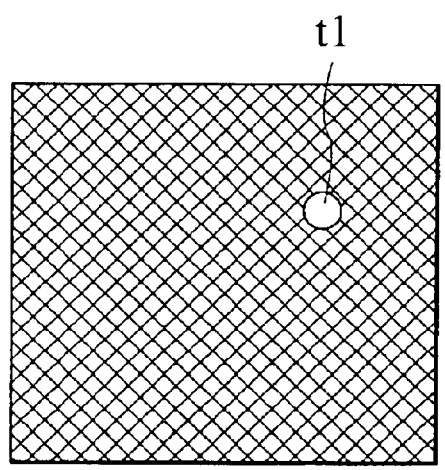
FIGS. 23A and 23B are diagrams showing an example of emission images as the emission measurement results of the passed sample corresponding to each test vector in the test vector pair extracted by the faulty part specifying method shown in FIG. 14.
Figure 23B:
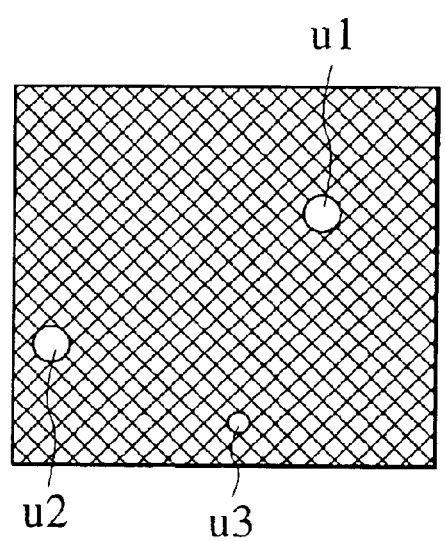

Next, like the process of the passed sample, the emission images shown in FIGS. 23A and 23B are obtained per extracted test vector pair. FIG. 23A shows an example of the emission image in the faulty sample before the change of the current value supplied to the fault sample. FIG. 23B shows an example of the emission image in the fault sample after the change of the current value. Where, the change of the current value is performed by switching the test vector in the test vectors shown in FIGS. 15A and 15B. The difference of the positions where the emission occurs is detected (Step S108) based on the emission images shown in FIGS. 23A and 23B in order to check the change of the emission positions.

Figure 24:
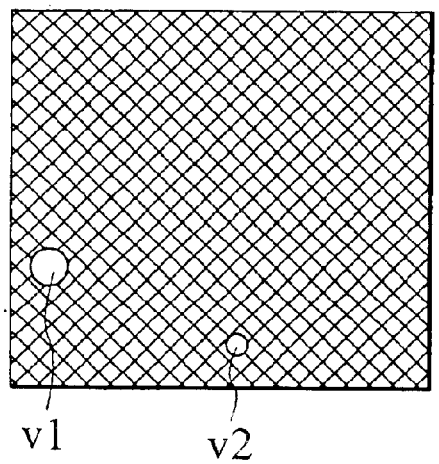
FIG. 24 is a diagram showing changed parts in the emission images measured by the faulty part specifying method shown in FIG. 14.

FIG. 24 shows the comparison result of the emission positions before and after the change of the current value in the faulty sample. In FIG. 24, the position "v1" (also "u3"

in FIG. 23B) indicates the emission area that has been changed after the change of the current value.

Next, the image data indicating the change part in the passed sample shown in FIG. 22 is compared with that of the faulty sample shown in FIG. 24, so that the change area "v1" that occurs only in the faulty sample can be specified (Step S109).

That is, as shown in FIGS. 25A, 25B, and 25C, the change area of the emission in the passed sample obtained by the process S106 shown in FIG. 22 is compared with that in the faulty sample obtained by the process S108 shown in FIG. 24, so that the change part of the emission shown in FIG. 25C in the faulty sample that occurs only in the faulty sample can be specified.

As shown in FIG. 25C, the area "w1" is the emission part that is unique to the faulty sample. It is therefore possible to decide that this area "w1" occurs by one or more defects in this faulty sample. Thereby, the faulty analysis can be performed based on this area "w1".

According to the second embodiment, the change rate of the current value per two addresses (indicating two test vectors, namely a test vector pair) and the range of the current-value change rate in the passed samples are obtained based on the data of the current value obtained by the IDDQ measurement using passed and faulty samples and plural test vectors. The current-value change rate in a faulty sample that is returned from a costumer after shipped is then compared with the above data, and the effective test vector pairs that are effective for the emission measurement to detect a defective part in the faulty sample are extracted. During the emission measurement, the emission images are obtained by using the effective test vector pair group. Then, the emission parts before and after the change of the current value in each of the passed sample and the faulty sample are compared in order to obtain the emission part that is unique to the faulty sample. This can specify the emission area that is caused by the defeat in the faulty sample. It is therefore possible to perform the fault analysis efficiently and to reduce the analysis time that is required to analysis the cause of the defect.

In the second embodiment, although the number of the test vectors to be used for the measurement of the change of the current value is two, the present invention is not limited by this, for example, it is possible to use three or more test vectors. In these cases, the current-value change rate can be measured by using test vectors each having plural dimensions.

Figure 26:
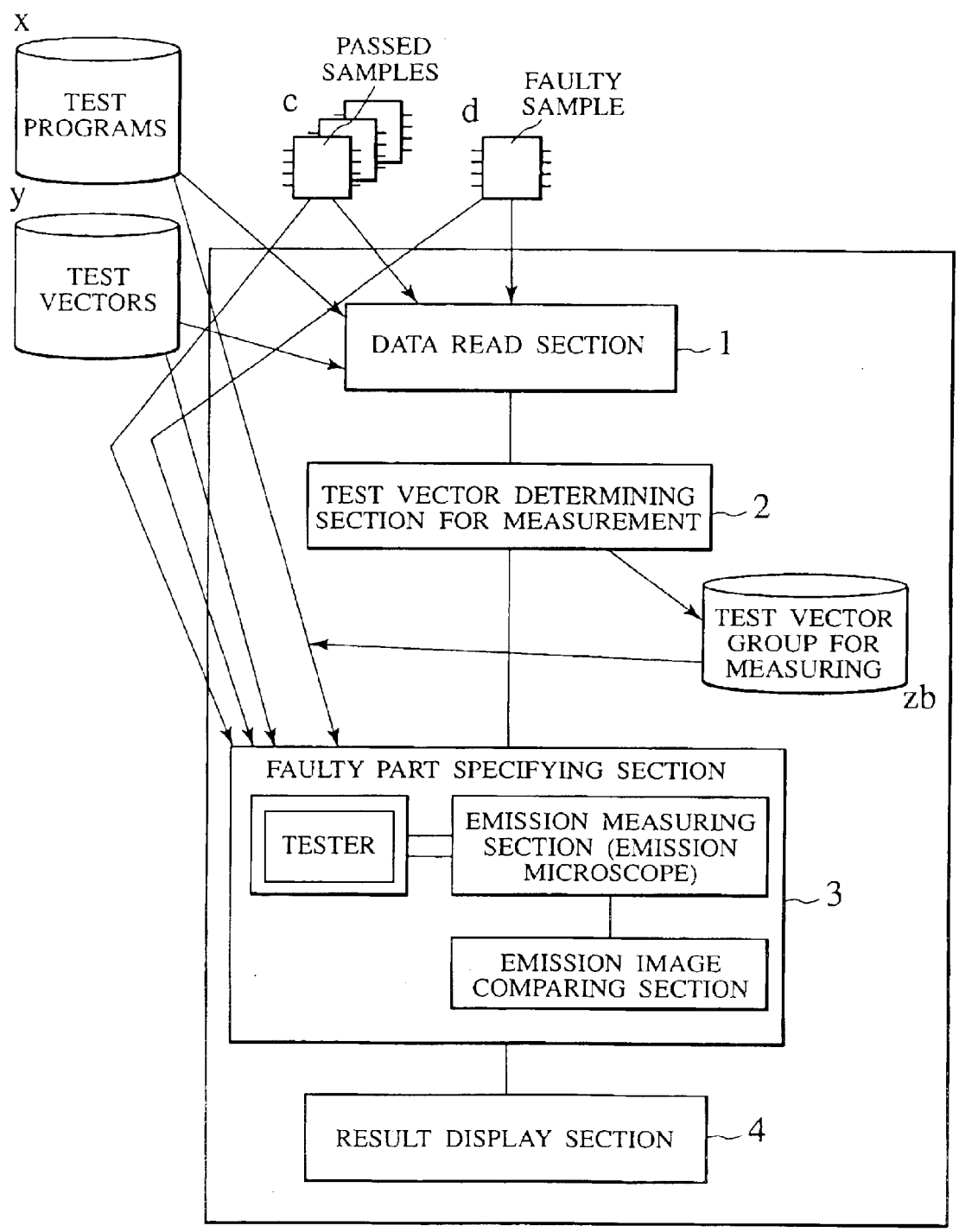
FIG. 26 is a block diagram showing an example of the configuration of the faulty part specifying apparatus as the semiconductor testing apparatus according to the second embodiment of the present invention.

FIG. 26 is a block diagram showing one example of the configuration of the faulty part specifying apparatus as the semiconductor testing apparatus of the preferred embodiment of the present invention. The faulty part specifying apparatus of this embodiment comprises a data read section 1, a test vector determining section 2 for measurement, a faulty part specifying section 3, and a result display section 4.

The data input section 4 has a function to input the test programs "x", the test vectors "y" and other information. The test vector determining section 2 for measurement is capable of obtaining test vectors, namely, effective address pairs to be used for the emission measurement based on the information that have been red by the data read section 1 and data of passed samples "o" and faulty sample "d".

Figure 27:
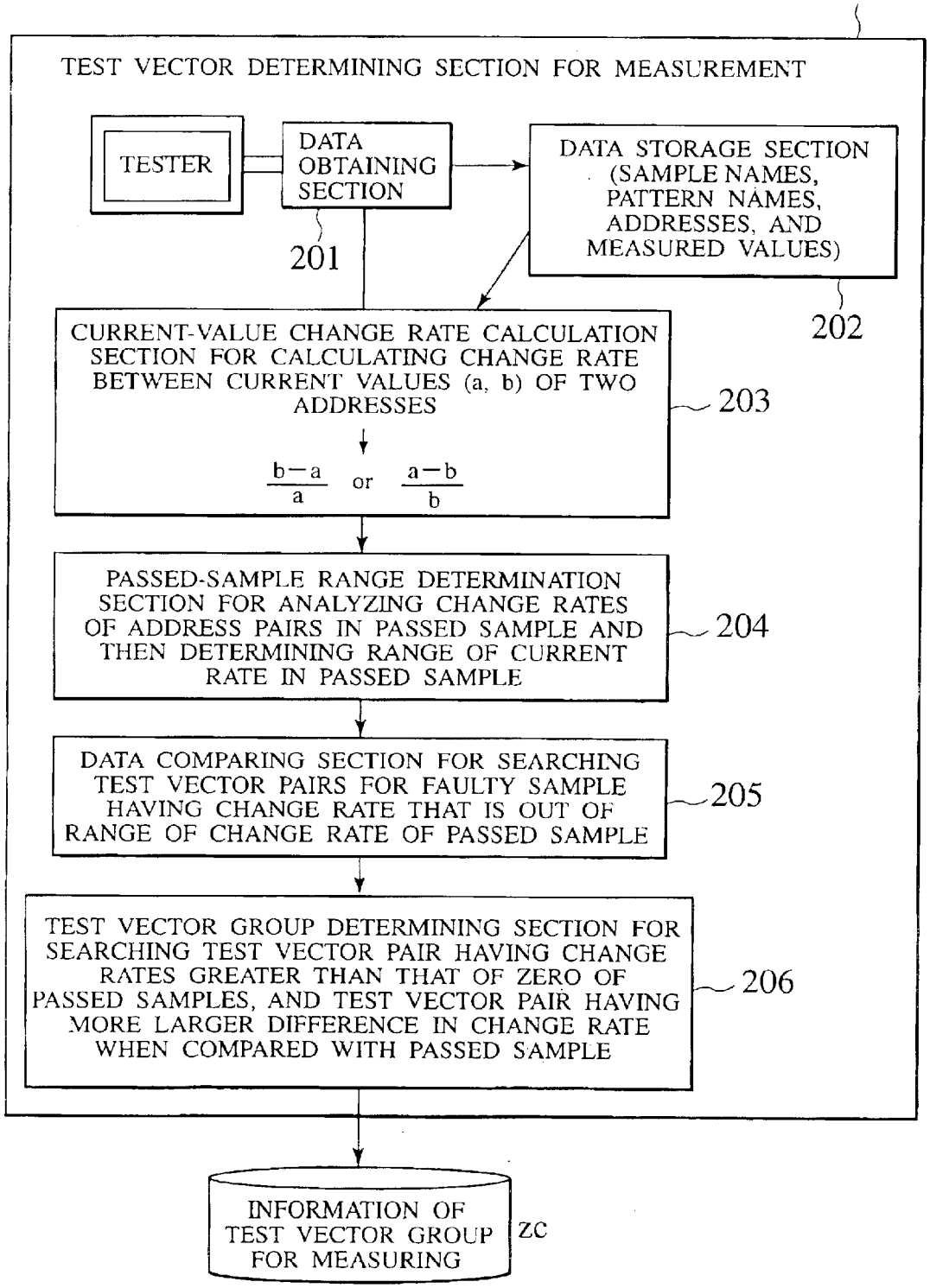
FIG. 27 is a diagram showing the operation of the test vector determining section in the faulty part specifying apparatus shown in FIG. 26.

FIG. 27 shows the configuration and operation of the test vector determining section 2 for measurement.

The data obtaining section 201 in the test vector determining section 2 performs the IDDQ measurement using the plural test vectors for the passed samples (that have been prepared in advance) and the faulty sample (that is a target sample in the analysis to specify one or more faulty parts) by using the tester, the test programs, and the test vectors. After the IDDQ measurement, the data obtaining section 202 outputs the measurement results to the data storage section 202.

The current-value change rate calculation section 203 calculates the current-value change rate per address pair based on the data stored in the data storage section 202.

The passed-sample range determining section 204 determining the range of the change rate in the passed samples by analyzing the change rates in the passed samples.

The data comparing section 205 searches the address pairs corresponding to the current-value change rates of the faulty sample that are out of the range of the current-value change rate of the passed sample while referring to the data about the change rates of the current value in the faulty sample.

The test vector group determining section 206 searches test vector pairs, that are out of the range of the change rates of the current value in the passed samples, specifically, that have a larger change rate in the range of the addresses where the change rate in the passed samples is zero, or that have a larger difference when compared with the change rates in the passed samples. Then, the test vector group determining section 206 extracts these effective test vector pairs.

The faulty part specifying section 3 has the function to detect the change in emission that is unique to the faulty sample and to specify one or more faulty parts involved in the faulty sample.

Figure 28:
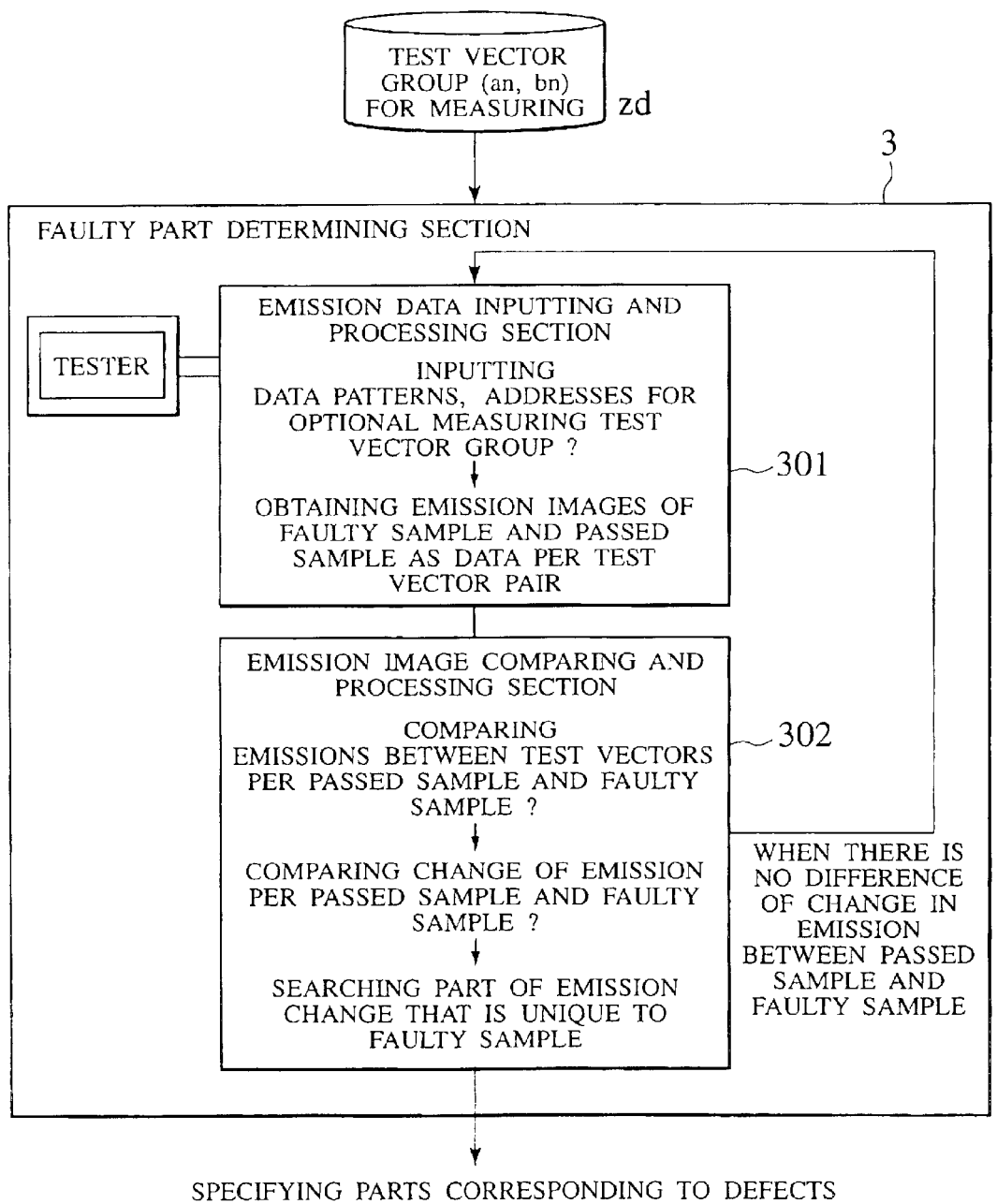
FIG. 28 is a diagram showing the operation of the faulty part specifying section in the faulty part specifying apparatus shown in FIG. 26.

FIG. 28 shows the configuration and operation of the faulty part specifying section 3.

The faulty part specifying section 3 comprises the emission data inputting and processing section 301 for obtaining emission data and the emission image comparing processing section 302 for comparing the emission images obtained.

The emission data inputting and processing section 301 reads data (test vector names, addresses, and the like) of the test vector pairs (an, bn) to be used for the measurement obtained by the test vector determining section 2, and obtains the emission images before and after the change of the current value per test vector in each of the passed sample and the faulty sample based on the obtained data.

Next, in order to specify change areas of the emission, the emission image comparing and processing section 302 compares the emission images obtained by the emission data inputting and processing section 301 before and after the change of the current value for each of the passed samples and the faulty sample.

Following this process, the change areas of the emission between the passed samples and the faulty sample are compared in order to specify the change area that is unique to the faulty sample. After this, the result display section 4 displays the image and the information to specify the change area that is unique to the faulty sample.

According to the second embodiment, because the faulty part specifying method as the semiconductor testing method of the present invention can be performed, it is possible to specify one or more faulty parts that are unique to the faulty sample and can not detected by any conventional testing method in which the amount of a current value per address (indicating a test vector) is compared. It is thereby possible to obtain the information about the cause of the defect, and also to reduce the time for the faulty analysis. This causes to increase the efficiency of the fault analysis. It is therefore possible to feedback the result of the fault analysis to a design stage (also to designers) and a process stage as the manufacture process of semiconductor devices, so that it is possible to reduce the number of occurrences of faulty samples as low as possible (namely, to improve and increase yields of semiconductor products), and also to increase the reliability of the semiconductor products to be shipped.

As set forth, the present invention has the following effects. Because the semiconductor testing apparatus according to the present invention comprises the determination circuit for determining the range of pass/fail decision criteria per address pair based on the first current-value change rates obtained from the good (non-defective) samples; and the decision circuit for comparing the second change rate obtained from the semiconductor device as the target test device with the above range of pass/fail decision criteria, it is thereby possible to detect faulty samples with a high throughput, which cannot be detected by any conventional semiconductor testing apparatus.

Furthermore, because the semiconductor testing method according to the present invention comprising: the step of determining the range of pass/fail decision criteria per address pair based on the first current-value change rates obtained from the good (not-defective) samples; and the step of comparing the change rate obtained from the faulty sample with the above range of pass/fail decision criteria per address pair, and of deciding whether faulty sample is good (passed) or fault using the criteria based on the current-value change rates per address pair extracted by the statistical process, it is thereby possible to detect faulty samples with a high throughput, which cannot be detected by any conventional semiconductor testing methods that performs IDDQ testing using only the current values. It is thereby possible to increase the efficiency of the analysis to analyze the cause of defects.

In addition, because the address pairs to be used during a mass production testing can be optionally combined, it is possible to adjust the testing time according to a required specification.

Furthermore, according to the program to execute the semiconductor testing method of the present invention, it is possible to execute the semiconductor testing method having the above effects by using the semiconductor testing apparatus with a general purpose computer.

Moreover, according to the faulty part specifying method and device of the present invention, because it is possible to perform the faulty analysis to analyze only the emission part that has a high possibility of the cause of a defect, it is possible to detect the faulty part that is unique to the faulty sample and cannot be detected by any conventional analysis method based on the magnitude of a current value, and possible to reduce the faulty analysis time, and to increase the testing efficiency.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor testing apparatus for testing semiconductor devices, comprising:
   an IDDQ measuring circuit configured to measure current data of good samples and samples returned by a user, by supplying test vector data to the good and returned samples;
   a determination circuit configured to determine a range of pass/fail decision criteria and effective address pairs for testing target semiconductor devices based upon the measured current data,
   wherein the IDDQ measuring circuit tests the target semiconductor devices by applying the test vector data for the effective address pairs, and
   wherein the semiconductor testing apparatus is configured to feed back data of the returned samples which have been shipped as the good samples, but returned from the user to a manufacturer as faulty samples so as to improve testing performance.

2. The apparatus of claim 1 wherein the determination circuit comprises:
   a changing rate calculation circuit configured to select a plurality of address pairs from the test vector data, to supply the address pairs to the good samples and the returned samples, to measure current-values of the good samples and returned samples, and to calculate changing rates of each of the good samples and returned samples;
   a range criteria determination circuit configured to determine the range of pass/fail decision criteria by using the changing rates of each of the good samples;
   a comparing circuit configured to compare the changing rates of each of the returned samples to the range of pass/fail decision criteria, and to determine whether the changing rates of each of the returned samples fall outside of the range of pass/fail decision criteria; and
   an effective address pair determination circuit configured to determine the changing rate falling out of the range of pass/fail decision criteria, and to select an address pair which makes the returned samples to provide the changing rate falling outside of the range of the pass/fail decision criteria as the effective address pair.

3. The apparatus of claim 1, wherein the IDDQ measuring circuit comprises:
   a tester configured to: acquire the effective address pair, supply the test data corresponding to the effective address pair to the target semiconductor device, measure current-value output of the target semiconductor device, and calculate changing rates of the target semiconductor device; and
   a decision circuit configured to determine a changing rate falling outside of the range of pass/fail decision criteria.

4. The apparatus of claim 1 further comprising a display configured to display the changing rate falling outside of the range of pass/fail decision criteria.

5. A semiconductor testing method for testing semiconductor devices, comprising:
   reading test vector data;
   measuring current data of good samples and samples returned by the a user, by supplying the test vector data to the good and returned samples;
   determining a range of pass/fail decision criteria and effective address pairs for testing target semiconductor devices based upon the measured current data; and
   applying the test vector data for the effective address pairs to the target semiconductor devices for testing,
   wherein the semiconductor testing method is configured to feed back data of the returned samples which have been shipped as the good samples, but returned from the user to a manufacturer as faulty samples so as to improve testing performance.

6. The method of claim 5, further comprising:
   selecting a plurality of address pairs from the test vector data;
   supplying the address pairs to the good samples and the returned samples;

measuring current-values of the good samples and the returned samples;

calculating changing rates of each of the good samples and the returned samples;

determining a range of pass/fail decision criteria by using the changing rates of each of the good samples;

comparing the changing rates of each of the returned samples to the range of pass/fail decision criteria;

determining whether the changing rates of each of the returned samples fall outside of the range of pass/fail decision criteria;

determining the changing rate falling outside of the range of pass/fail decision criteria; and selecting an address pair which makes the returned samples to provide the changing rate falling outside of the range of pass/fail decision criteria as the effective address pair.

7. The method of claim 5, further comprising:

acquiring the effective address pair;

supplying the test vector data corresponding to the effective address pair to the target semiconductor devices;

measuring current-value output of the target semiconductor devices;

calculating change rates of the target semiconductor devices; and determining a changing rate falling outside of the range of pass/fail decision criteria.

8. The method of claim 7, further comprising displaying the changing rate falling outside of the range of pass/fail decision criteria on a display.

9. A program with which a semiconductor testing method is executed by a computer in a semiconductor testing apparatus which comprises a read circuit, a determination circuit, and an IDDQ measuring circuit configured to test semiconductor devices by applying test vector data, the program comprising:

instructions configured to read the test vector data;

instructions configured to supply the test vector data to good samples and samples returned by a user;

instructions configured to measure current data of the good and returned samples;

instructions configured to determine a range of pass/fail decision criteria and effective address pairs for testing target semiconductor devices based upon the measured current data; and instructions configured to apply the test vector data for the effective address pairs for testing, wherein a semiconductor testing apparatus is configured to feed back data of the returned samples which have been shipped as the good samples, but returned from the user to a manufacturer as faulty samples so as to improve testing performance.

10. The program of claim 9, further comprising:

instructions configured to select a plurality of address pairs from the test vector data;

instructions configured to supply the address pairs to the good samples and the returned samples;

instructions configured to measure current-values of the good samples and the returned samples;

instructions configured to calculate changing rates of each of the good samples and the returned samples;

instructions configured to determine a range of pass/fail decision criteria by using the changing rates of each of the good samples;

instructions configured to compare the changing rates of each of the returned samples to the range of pass/fail decision criteria;

instructions configured to determine whether the changing rates of each samples fall outside of the range of pass/fail decision criteria;

instructions configured to determine the changing rate falling outside of the range of pass fail decision criteria; and instructions configured to select an address pair that makes the returned samples to provide the changing rate falling outside of the range of pass/fail decision criteria as the effective address pair.

11. The program of claim 9, further comprising:

instructions configured to acquire the effective address pair;

instructions configured to supply the test vector data corresponding to the effective address pair to the target semiconductor devices;

instructions configured to measure current-value output of the target semiconductor devices;

instructions configured to calculate changing rates of the target semiconductor devices; and instructions configured to determine a changing rate falling outside of the range of pass/fail decision criteria.

12. The program of claim 11, further comprising instructions configured to display the changing rate falling outside of the range of pass/fail decision criteria on a display.

13. A semiconductor testing method of specifying a faulty part in a semiconductor device, the method comprising:

reading a test program and test vector data;

supplying the test vector data to good samples and samples returned by a user;

measuring current data of the good samples and returned samples, employing an IDDQ measuring circuit;

determining a range of pass/fail decision criteria and effective address pairs for testing target semiconductor devices in a manufacturing process based upon the measured current data;

applying the test vector data for the effective address pairs to a target semiconductor device; and specifying a faulty part within the target semiconductor device by measuring an emission from the target semiconductor device, wherein the semiconductor device is configured to feed back data of the returned samples which have been shipped as the good samples, but returned from the user to manufacturer as faulty samples so as to improve testing performance.

14. The method of claim 13, further comprising:

selecting a plurality of address pairs from the test vector data;

supplying the address pairs to the good samples and the returned samples;

measuring current-values of the good samples and returned samples;

calculating changing rates of each of the good samples and returned samples;

determining a range of pass/fail decision criteria by using the changing rates of each of the good samples;

comparing the changing rates of each of the returned samples to the range of pass/fail decision criteria;

determining whether the changing rates of each of the returned samples fall outside of the range of pass/fail decision criteria;

determining the changing rate falling outside of the range of pass/fail decision criteria; and selecting an address pair which makes the returned samples to provide the changing rate falling outside of the range of pass/fail decision criteria as the effective address pair.

15. The method of claim 13, wherein determining a range of pass/fail decision criteria is achieved by:

a changing rate calculation circuit configured to select a plurality of address pairs from the test vector data, to supply the address pairs to the good samples and the returned samples, to measure current-values of the good samples and returned samples, and to calculate changing rates of each of the good samples and returned samples;

a range criteria determination circuit configured to determine a range of pass/fail decision criteria by using the changing rates of each of the good samples;

a comparing circuit configured to compare the changing rates of each of the returned samples to the range of pass/fail decision criteria, and to determine whether the changing rates of each of the returned samples fall outside of the range of pass/fail decision criteria; and an effective address pair determination circuit configured to determine the changing rate falling outside of the range of pass/fail decision criteria, and to select an address pair that makes the returned samples to provide the changing rate falling outside of the range of pass/fail decision criteria as an effective address pair.

16. The method of claim 14, wherein the faulty part specifying step further comprises:

acquiring the effective address pair;

supplying the test vector data corresponding to the effective address pair to the target semiconductor device;

measuring current-value output of the target semiconductor device;

calculating changing rates of the target semiconductor device;

measuring an emission from the target semiconductor device; and determining a changing rate falling outside of the range of pass/fail decision criteria.

17. The method of claim 15, wherein the faulty part specifying circuit further comprises:

a tester configured to acquire the effective address pair, to supply the test vector data corresponding to the effective address pair to the target semiconductor device, to measure current-value output of the target semiconductor device, and to calculate changing rates of the target semiconductor device;

an emission measuring circuit configured to measure an emission from the target semiconductor device; and a decision circuit configured to determine a changing rate falling outside of the range of pass/fail decision criteria.

18. A semiconductor testing apparatus for specifying a faulty part in a semiconductor device, the apparatus comprising:

a read circuit configured to read test vector data and a test program;

an IDDQ measuring circuit configured to measure current data of good samples and samples returned by a user, by supplying the test vector data to the good and returned samples;

a determination circuit configured to determine a range of pass/fail decision criteria and effective address pairs for testing target semiconductor devices in a manufacturing process; and a faulty part specifying circuit configured to apply the test vector data for the effective address pairs to the target semiconductor device and to specify a faulty part by measuring an emission from the target semiconductor device, wherein the semiconductor testing apparatus is configured to feed back data of the returned samples which have been shipped as the good samples, but returned from the user to a manufacturer as faulty samples so as to improve testing performance.

19. A program with which a semiconductor testing method is executed by a computer in a semiconductor testing apparatus which comprises a read circuit, a determination circuit, and a faulty part specifying circuit, the program comprising:

instructions configured to read a test program and test vector data;

instructions configured to measure current data of good samples and samples returned by a user, employing an IDDQ measuring circuit, by supplying the test vector data to the good and returned samples;

instructions configured to determine a range of pass/fail decision criteria and effective address pairs for testing target semiconductor devices in a manufacturing process based upon the measured data;

instructions to apply the test vector data for the effective address pairs to the target semiconductor device; and instructions to specify a faulty part within the target semiconductor device by measuring an emission from the target semiconductor device, wherein the semiconductor testing apparatus is configured to feed back data of the returned samples which have been shipped as the good samples, but returned from the user to a manufacturer as faulty samples so as to improve testing performance.

* * * * *

UNITED STATES PATENT AND TRADEMARK OFFICE
CERTIFICATE OF CORRECTION

PATENT NO. : 6,810,344 B1
DATED : October 26, 2004
INVENTOR(S) : Iwasa

It is certified that error appears in the above-identified patent and that said Letters Patent is hereby corrected as shown below:

Column 22,
Line 50, change "by the a" to -- by a --.

Signed and Sealed this

Eighth Day of February, 2005

JON W. DUDAS
*Director of the United States Patent and Trademark Office*